US011493711B2

United States Patent
Shen et al.

(10) Patent No.: US 11,493,711 B2
(45) Date of Patent: Nov. 8, 2022

(54) HYBRID MULTI-LAYERED OPTICAL FLEXIBLE PRINTED CIRCUIT DEVICE AND MANUFACTURING METHOD THEREOF

(71) Applicant: AuthenX Inc., Hsinchu County (TW)

(72) Inventors: Po-Kuan Shen, Hsinchu County (TW); Chao-Chieh Hsu, Hsinchu County (TW); Sheng-Fu Lin, Hsinchu County (TW); Chun-Chiang Yen, Hsinchu County (TW); Chiu-Lin Yu, Hsinchu County (TW); Kai-Lun Han, Hsinchu County (TW); Jenq-Yang Chang, Hsinchu County (TW); Mao-Jen Wu, Hsinchu County (TW)

(73) Assignee: AuthenX Inc., Hsinchu County (TW)

( * ) Notice: Subject to any disclaimer, the term of this patent is extended or adjusted under 35 U.S.C. 154(b) by 72 days.

(21) Appl. No.: 17/321,500

(22) Filed: May 17, 2021

(65) Prior Publication Data
US 2021/0356682 A1 Nov. 18, 2021

Related U.S. Application Data

(60) Provisional application No. 63/026,057, filed on May 17, 2020.

(51) Int. Cl.
*G02B 6/42* (2006.01)
*G02B 6/125* (2006.01)
*G02B 6/43* (2006.01)
*H05K 1/18* (2006.01)

(52) U.S. Cl.
CPC ............ *G02B 6/428* (2013.01); *G02B 6/125* (2013.01); *G02B 6/43* (2013.01)

(58) Field of Classification Search
CPC .......... G02B 6/428; G02B 6/125; G02B 6/43; G02B 6/4232; G02B 6/4214; G02B 6/4281; H05K 1/0216; H05K 1/189; H05K 1/0274; H05K 1/0283; H05K 1/147; H05K 2201/09985; H05K 2201/10121; H05K 2201/1053; H05K 3/30; H05K 3/4688
See application file for complete search history.

(56) References Cited

U.S. PATENT DOCUMENTS

| 8,708,576 | B2 | 4/2014 | Shacklette et al. |
| 9,046,646 | B2 | 6/2015 | Tsujita et al. |
| 9,116,292 | B2 * | 8/2015 | Fujiwara .............. G02B 6/4214 |
| 9,720,171 | B2 | 8/2017 | Arai |

\* cited by examiner

*Primary Examiner* — Ryan A Lepisto
*Assistant Examiner* — Erin D Chiem

(57) ABSTRACT

A hybrid multi-layered optical flexible printed circuit device, comprising: an optical flexible substrate including a first open window and a second open window with a first, a second surfaces opposite to each other; an intrinsic film including a first bonding region aligned with the first open window and a second bonding region aligned with the second open window formed on the first surface; an optical waveguide film including a first notch with a first slant surface aligned with the first bonding region, and a second notch with a second slant surface aligned with the second bonding region formed on the second surface and encompassed the first open window and the second open window; a first flexible printed circuit board formed on the optical waveguide film; and a first optoelectronic device and a second optoelectronic device mounted in the first bonding region and the second bonding region of the intrinsic film.

20 Claims, 27 Drawing Sheets

HYBRID MULTI-LAYERED OPTICAL FLEXIBLE PRINTED CIRCUIT DEVICE AND MANUFACTURING METHOD THEREOF

CROSS-REFERENCE TO RELATED APPLICATION

This application claims the benefit of U.S. provisional application Ser. No. 63/026,057, filed on May 17, 2020, the subject matter of which is incorporated herein by reference.

BACKGROUND OF THE INVENTION

Field of the Invention

This invention relates generally to optical communications, and more particularly relates to hybrid multi-layered optical flexible printed circuit devices and manufacturing methods thereof.

Description of the Prior Art

Smart phones and other mobile devices have become increasingly feature rich in computing capabilities. They may be equipped with megapixel cameras and high-resolution displays, supporting high-speed internet and high-definition video and 3D graphics and gaming access and a wide area of RF functions such as Wi-Fi, Bluetooth, WLAN, GPS, GSM etc. At times, multiple applications may be opened running in multiple windows, requiring high-speed computing power, ever pushing mobile device processors clock rates higher.

Meanwhile, parallel bus interfaces in mobile devices are being replaced by higher-speed serial links. Serial data links offer reduced pin count, number of transmission lines, suppressed interference and lower-power consumption. The supported data rate, for instance, at the MIPI Camera Serial Interface 2 (CSI-2) and D-PHY is 800 Mb/s to 1 Gpbs per lane, and is scalable up to 4 Gbit/s with four lanes.

Nevertheless, multi-gigabit data links for display and camera modules may comprise of spectrum components that overlap with cellular frequencies, which would make the data links prone to EM coupling to/from positioning and mobile antennas located in close proximity. Additionally, connector emissions may lower signal quality and impedance control. Furthermore, with continued miniaturization, increased component density, and increased number of high-speed chip packages, thermal management challenges are increased in the design of mobile devices.

Flexible printed circuits are generally used in electrical devices to connect functional modules in locations where flexible or bendable interconnects may be employed. For example, a flexible printed circuit may be employed through a connection hinge for connection between an upper (e.g. having a display part) and lower block (e.g. having a host processor) of a foldable mobile phone. In the example, around 30 to 60 or more signals may be transferred in parallel traces through the hinge. However, at high frequencies, the copper traces utilized suffer from emissions and electromagnetic interference (EMI), degrading signal integrity and increasing crosstalk. While optical flexible printed circuits may be employed to enhance bandwidths and improve signal quality, manufacturing thereof is a challenge, when faced with requirements such as multi-metal layers for multiple power or low-speed signal requirements given multi-layer alignment limitations and material property differences.

SUMMARY OF THE INVENTION

One aspect of this invention is to provide a hybrid multi-layered optical flexible printed circuit device, comprising: an optical flexible substrate including a first open window and a second open window with a first surface and a second surface opposite to each other; an intrinsic film including a first bonding region aligned with the first open window and a second bonding region aligned with the second open window formed on the first surface of the optical flexible substrate; an optical waveguide film including a first notch with a first slant surface aligned with the first bonding region, and a second notch with a second slant surface aligned with the second bonding region formed on the second surface of the optical flexible substrate and encompassed the first open window and the second open window; a first flexible printed circuit board including first metal traces, a first open region aligned with the first open window and a second open region aligned with the second open window formed on the optical waveguide film, and/or a second flexible printed circuit board including second metal traces, a third open region aligned with the first open window and a fourth open region aligned with the second open window formed on the intrinsic film; and a first optoelectronic device and a second optoelectronic device respectively mounted in the first bonding region and the second bonding region of the intrinsic film; wherein, the first optoelectronic device is used to convert electrical signals into optical intensity signals and emit into the waveguide film thereafter, and the second optoelectronic device is used to convert optical intensity signals received from the waveguide film into electrical signals.

The hybrid multi-layered optical flexible printed circuit device as mention above, wherein the intrinsic film comprises an insulative layer, a patterned metal layer formed on the insulative layer and a cover layer formed on the patterned metal layer to cover part of the patterned metal layer, wherein the intrinsic film is formed on the first surface of the optical flexible substrate via the insulative layer, and the patterned metal layer in the first bonding region and the patterned metal layer in the second bonding region are exposed.

The hybrid multi-layered optical flexible printed circuit device as mention above, further comprising a first connection window formed throughout the intrinsic film, the optical flexible substrate and the optical waveguide film to expose part of the first metal traces of the first flexible printed circuit board, and/or a second connection window formed throughout the second flexible printed circuit board to expose part of the patterned metal layer of the intrinsic film.

The hybrid multi-layered optical flexible printed circuit device as mention above, wherein the optical waveguide film comprises an upper cladding layer, a lower cladding layer and a waveguide core layer sandwiched therebetween, and the first notch and the second notch are throughout the lower cladding layer, the waveguide core layer and part of the upper cladding layer, and the optical waveguide film is formed on the second surface of the optical flexible substrate and encompassed the first open window and the second open window via the upper cladding layer.

The hybrid multi-layered optical flexible printed circuit device as mention above, wherein the optical flexible substrate is formed by a material selected from one of a group consisting of a polyimide, a metal and a liquid crystal polymer (LCP).

The hybrid multi-layered optical flexible printed circuit device as mention above, further comprising a third optoelectronic device and a fourth optoelectronic device respectively mounted in the first bonding region and the second bonding region, and the fourth optoelectronic device is used to convert electrical signals into optical intensity signals and emit into the waveguide film thereafter, and the third optoelectronic device is used to convert optical intensity signals received from the waveguide film into electrical signals.

The hybrid multi-layered optical flexible printed circuit device as mention above, wherein the first optoelectronic device and the fourth optoelectronic device are individual optical signal emitting devices, and the second optoelectronic device and the third optoelectronic device are individual optical signal receiving devices.

The hybrid multi-layered optical flexible printed circuit device as mention above, wherein the first flexible printed circuit board is a single-layered flexible printed circuit board, a double-layered flexible printed circuit board or a multi-layered flexible printed circuit board, and/or the second flexible printed circuit board is a single-layered flexible printed circuit board, a double-layered flexible printed circuit board or a multi-layered flexible printed circuit board.

The hybrid multi-layered optical flexible printed circuit device as mention above, wherein the first slant surface of the first notch having an included angle ranging θ1 between 25 degree and 75 degree, and the second slant surface of the second notch having an included angle θ2 ranging between 25 degree and 75 degree.

The hybrid multi-layered optical flexible printed circuit device as mention above, the first flexible printed circuit board is formed on the optical waveguide film via a first adhesive layer and/or a first anisotropic conductive film and/or first solder balls and/or first metal bumps, and/or the second flexible printed circuit board is formed on the intrinsic film via a second adhesive layer and/or a second anisotropic conductive film and/or second solder balls and/or second metal bumps.

Another aspect of this invention is to provide a method for manufacturing a hybrid multi-layered optical flexible printed circuit device as mentioned above, comprising the steps of: providing an optical flexible substrate with a first surface and a second surface opposite to each other; forming an intrinsic film including a first bonding region and a second bonding region on the first surface of the optical flexible substrate; forming a first open window aligned with the first bonding region and a second open window aligned with the second bonding region on the optical flexible substrate; forming an optical waveguide film on the second surface of the optical flexible substrate and encompassed the first open window and the second open window; forming a first flexible printed circuit board including first metal traces, a first open region aligned with the first open window and a second open region aligned with the second open window on the optical waveguide film, and/or forming a second flexible printed circuit board including second metal traces, a third open region aligned with the first open window and a fourth open region aligned with the second open window on the intrinsic film; forming a first notch with a first slant surface aligned with the first bonding region on the optical waveguide film, and a second notch with a second slant surface aligned with the second bonding region on the optical waveguide film; and mounting a first optoelectronic device and a second optoelectronic device respectively in the first bonding region and the second bonding region; wherein, the first optoelectronic device is used to convert electrical signals into optical intensity signals and emit into the waveguide film thereafter, and the second optoelectronic device is used to convert optical intensity signals received from the waveguide film into electrical signals.

The method for manufacturing a hybrid multi-layered optical flexible printed circuit device as mentioned above, wherein the intrinsic film comprises an insulative layer, a patterned metal layer formed on the insulative layer and a cover layer formed on the patterned metal layer to cover part of the patterned metal layer, wherein the intrinsic film is formed on the first surface of the optical flexible substrate via the insulative layer, and the patterned metal layer in the first bonding region and the patterned metal layer in the second bonding region are exposed.

The method for manufacturing a hybrid multi-layered optical flexible printed circuit devices as mentioned above, further comprising a first connection window formed throughout the intrinsic film, the optical flexible substrate and the optical waveguide film to expose part of the first metal traces of the first flexible printed circuit board, and/or a second connection window formed throughout the second flexible printed circuit board to expose part of the patterned metal layer of the intrinsic film.

The method for manufacturing a hybrid multi-layered optical flexible printed circuit device as mentioned above, wherein the optical waveguide film comprises an upper cladding layer, a lower cladding layer and a waveguide core layer sandwiched therebetween, and the first notch and the second notch are throughout the lower cladding layer, the waveguide core layer and part of the upper cladding layer, and the optical waveguide film is formed on the second surface of the optical flexible substrate and encompassed the first open window and the second open window via the upper cladding layer.

The method for manufacturing a hybrid multi-layered optical flexible printed circuit device as mentioned above, wherein the optical flexible substrate is formed by a material selected from one of a group consisting of a polyimide, a metal and a liquid crystal polymer (LCP).

The method for manufacturing a hybrid multi-layered optical flexible printed circuit device as mentioned above, further comprising a step of mounting a third optoelectronic device and a fourth optoelectronic device respectively in the first bonding region and the second bonding region, and the fourth optoelectronic device is used to convert electrical signals into optical intensity signals and emit into the waveguide film thereafter, and the third optoelectronic device is used to convert optical intensity signals received from the waveguide film into electrical signals.

The method for manufacturing a hybrid multi-layered optical flexible printed circuit device as mentioned above, wherein the first flexible printed circuit board is a single-layered flexible printed circuit board, a double-layered flexible printed circuit board or a multi-layered flexible printed circuit board, and/or the second flexible printed circuit board is a single-layered flexible printed circuit board, a double-layered flexible printed circuit board or a multi-layered flexible printed circuit board.

The method for manufacturing a hybrid multi-layered optical flexible printed circuit device as mentioned above, wherein the first notch and the second notch are respectively formed by laser cutting or mechanical cutting through the first open region and the second open region.

The method for manufacturing a hybrid multi-layered optical flexible printed circuit device as mentioned above, wherein the first slant surface of the first notch having an included angle θ1 ranging between 25 degree and 75 degree, and the second slant surface of the second notch having an included angle θ2 ranging between 25 degree and 75 degree.

The method for manufacturing a hybrid multi-layered optical flexible printed circuit device as mentioned above, wherein the first flexible printed circuit board is formed on the optical waveguide film via a first adhesive layer and/or a first anisotropic conductive film and/or first solder balls and/or first metal bumps, and/or the second flexible printed circuit board is formed on the intrinsic film via a second adhesive layer and/or a second anisotropic conductive film and/or second solder balls and/or second metal bumps.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several examples of optical communications incorporating aspects of the presently disclosed principles are illustrated by way of example, and not by way of limitation.

FIG. 1A' is a schematic top view of a hybrid multi-layered optical flexible printed circuit device 100' according to Embodiment 2 of this invention.

FIG. 1B' is a schematic cross-sectional view of the hybrid multi-layered optical flexible printed circuit device 100' according to Embodiment 2 of this invention along with the cross-sectional line IB-IB' shown in FIG. 1A'.

FIG. 7A' is a schematic top view of a hybrid multi-layered optical flexible printed circuit device 101' according to Embodiment 4 of this invention.

FIG. 7B' is a schematic cross-sectional view of the hybrid multi-layered optical flexible printed circuit device 101' according to Embodiment 4 of this invention along with the cross-sectional line VIIB-VIIB' shown in FIG. 7A'.

FIG. 8A' is a schematic top view of a hybrid multi-layered optical flexible printed circuit device 102' according to Embodiment 6 of this invention.

FIG. 8B' is a schematic cross-sectional view of the hybrid multi-layered optical flexible printed circuit device 102' according to Embodiment 6 of this invention along with the cross-sectional line VIIIB-VIIIB' shown in FIG. 8A'.

DETAILED DESCRIPTION

Figure 1A:
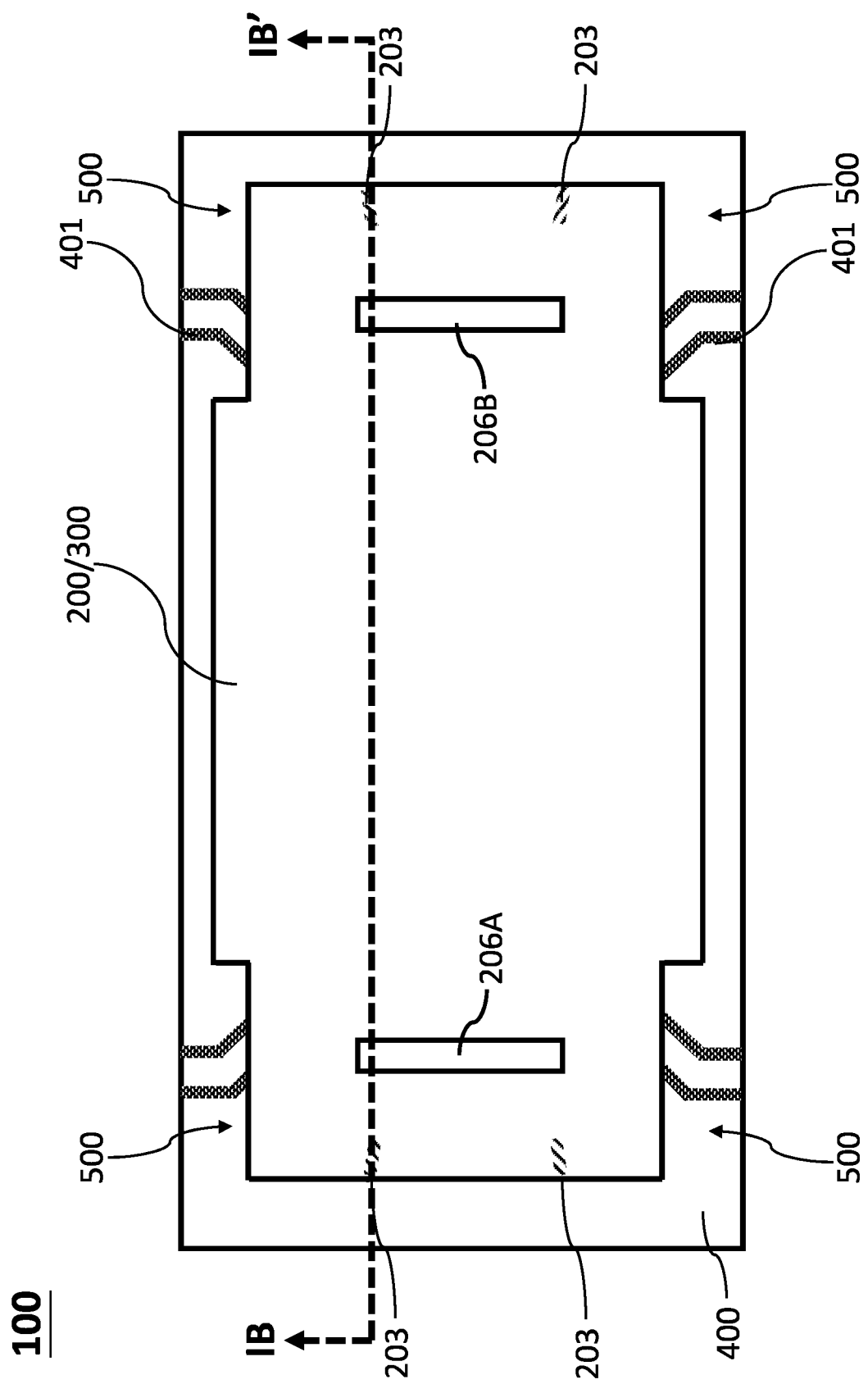
FIG. 1A is a schematic top view of a hybrid multi-layered optical flexible printed circuit device 100 according to Embodiment 1 of this invention.
Figure 1A:
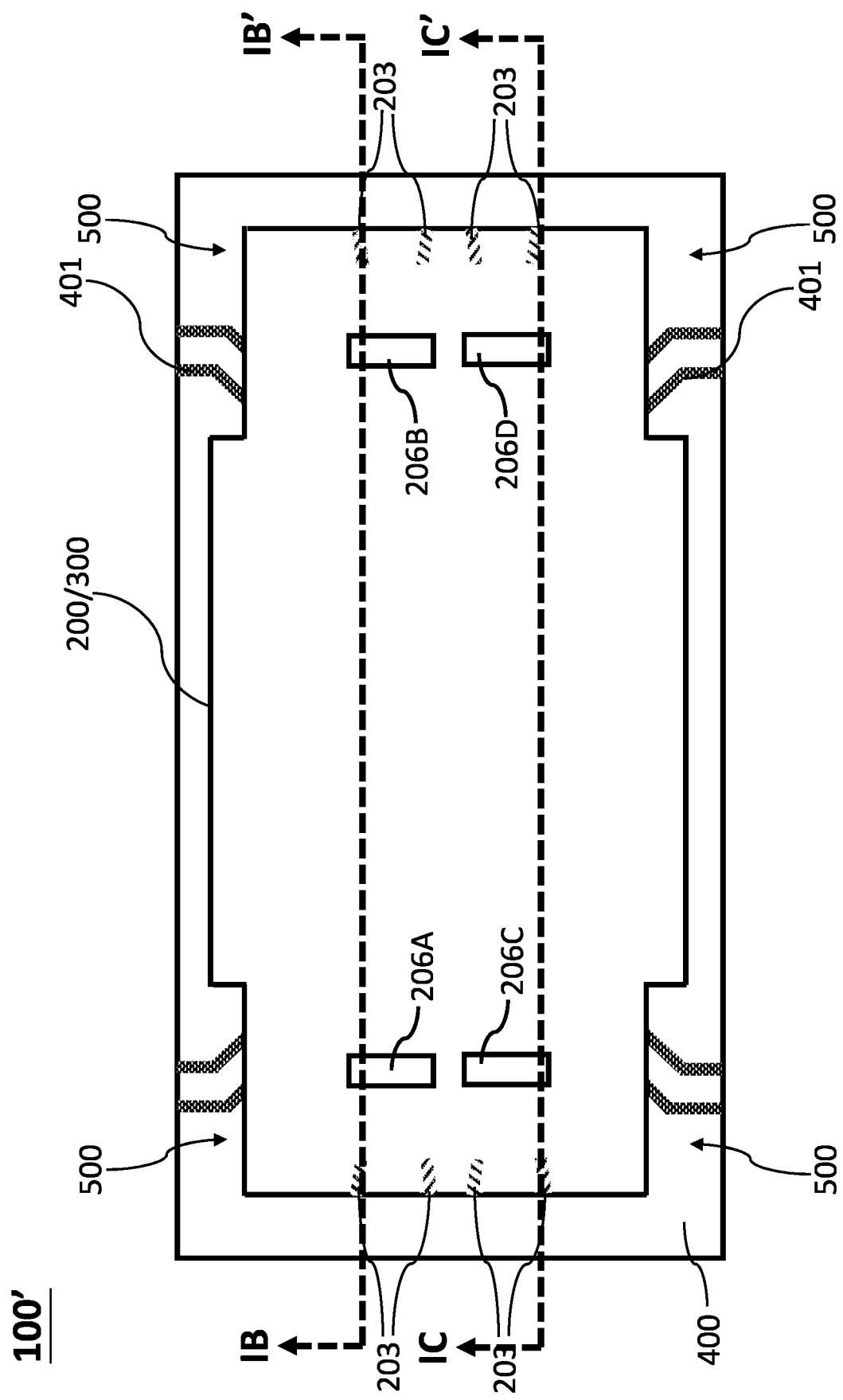

The following describes various principles related to optical communications by way of reference to specific examples of optical communications, and hybrid multi-layered optical flexible printed circuit devices, including arrangements and examples of hybrid multi-layered optical flexible printed circuit devices, and manufacturing methods thereof embodying innovative concepts. More particularly, but not exclusively, such innovative principles are described in relation to selected examples of optical communications, and hybrid multi-layered optical flexible printed circuit devices and well-known functions or constructions are not described in detail for purposes of succinctness and clarity. Nonetheless, one or more of the disclosed principles can be incorporated in various other embodiments of optical communications, and hybrid multi-layered optical flexible printed circuit devices to achieve any of a variety of desired outcomes, characteristics, and/or performance criteria.

Thus, optical communications, and hybrid multi-layered optical flexible printed circuit devices having attributes that are different from those specific examples discussed herein can embody one or more of the innovative principles, and can be used in applications not described herein in detail. Accordingly, embodiments of optical communications, and hybrid multi-layered optical flexible printed circuit devices not described herein in detail also fall within the scope of this disclosure, as will be appreciated by those of ordinary skill in the relevant art following a review of this disclosure.

The presently disclosed inventive concepts are not intended to be limited to the embodiments shown herein, but are to be accorded their full scope consistent with the principles underlying the disclosed concepts herein. Directions and references to an element, such as "up", "down", "upper", "lower", "horizontal", "vertical", "left", "right" and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless specifically so stated. Reference to an element in the singular, such as by use of the article "a" or "an", is not intended to mean "one and only one" unless specifically so stated, but rather "one or more". As used herein, "and/or" means "and" or "or", as well as "and" and "or". As used herein, ranges and subranges mean all ranges including whole and/or fractional values therein and language which defines or modifies ranges and subranges, such as "at least" "greater than" "less than" "no more than" and the like, mean subranges and/or an upper or lower limit. All structural and functional equivalents to the elements of the various embodiments described throughout the disclosure that are known or later come to be known to those of ordinary skill in the relevant art are intended to be encompassed by the features described and claimed herein. Moreover, nothing disclosed herein is intended to be dedicated to the public regardless of whether such disclosure may ultimately explicitly be recited in the claims.

Embodiments

Embodiment 1

Figure 1B:
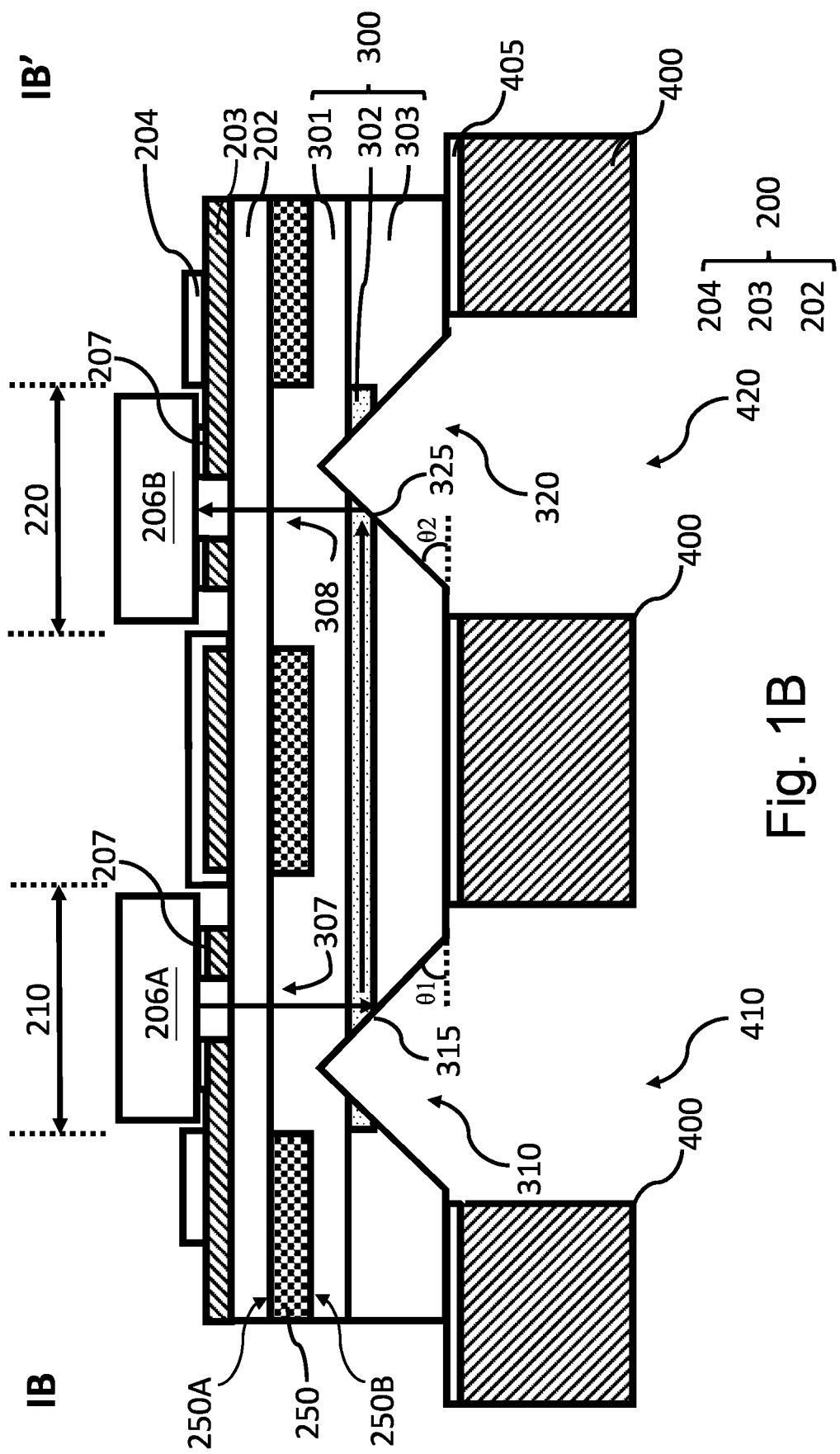
FIG. 1B is a schematic cross-sectional view of the hybrid multi-layered optical flexible printed circuit device 100 according to Embodiment 1 of this invention along with the cross-sectional line IB-IB' shown in FIG. 1A.
Figure 1B:
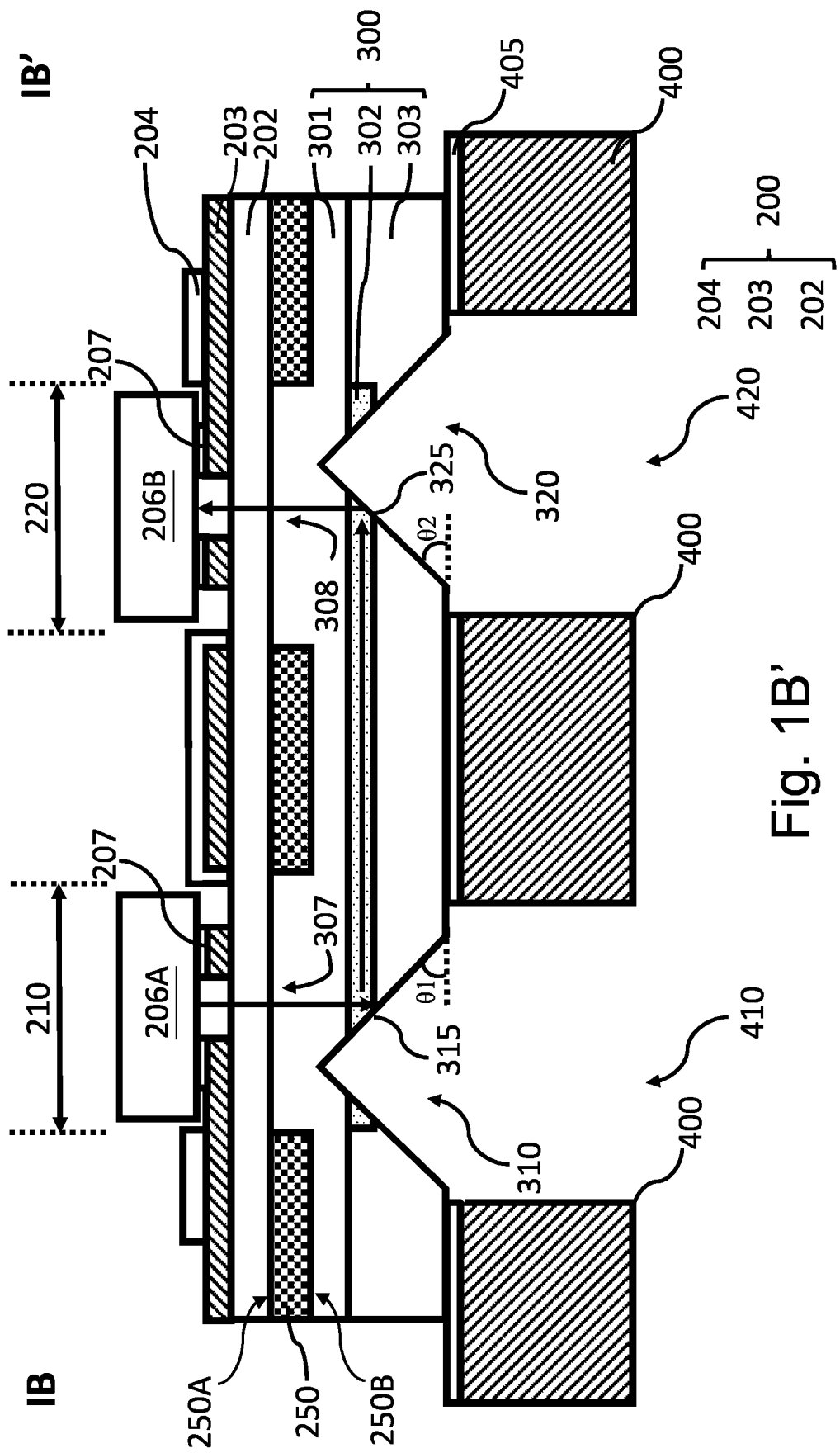

A hybrid multi-layered optical flexible printed circuit device 100 according to Embodiment 1 of this invention as shown in FIGS. 1A~1B is disclosed, which was manufactured by the steps illustrated in the flowcharts shown in FIG. 2 and FIGS. 3A~3C, 4A~4D, 5A~5C and 6.

Please refer to FIGS. 1A~1B. FIG. 1A is a schematic top view of a hybrid multi-layered optical flexible printed circuit device 100 according to Embodiment 1 of this invention. FIG. 1B is a schematic cross-sectional view of the hybrid multi-layered optical flexible printed circuit device 100 according to Embodiment 1 of this invention along with the cross-sectional line IB-IB' shown in FIG. 1A. As shown in FIGS. 1A~1B, the hybrid multi-layered optical flexible printed circuit device 100 according to Embodiment 1 of this invention comprises an optical flexible substrate 250 including a first open window 307 and a second open window 308 with a first surface 250A and a second surface 250B opposite to each other, an intrinsic film 200 including a first bonding region 210 aligned with the first open window 307 and a second bonding region 220 aligned with the second open window 308 formed on the first surface 250A of the optical flexible substrate 250, an optical waveguide film 300 including a first notch 310 with a first slant surface 315 aligned with the first bonding region 210, and a second notch 320 with a second slant surface 325 aligned with the second bonding region 220 formed on the second surface 250B of the optical flexible substrate 250 and encompassed the first open window 307 and the second open window 308, a first flexible printed circuit board 400 including first metal traces 401, a first open region 410 aligned with the first open window 307 and a second open region 420 aligned with the second open window 308 formed on the optical waveguide film 300, and a first optoelectronic device 206A and a second optoelectronic device 206B respectively mounted in the first bonding region 210 and the second bonding region 220 of the intrinsic film 200. The optical intensity signals emitted by the first optoelectronic device 206A is received by the second optoelectronic device 206B through the optical waveguide film 300.

As shown in FIG. 1A~1B, the intrinsic film 200 comprises an insulative layer 202, a patterned metal layer 203 formed on the insulative layer 202 and a cover layer 204 formed on the patterned metal layer 203 to cover part of the patterned metal layer 203, wherein the intrinsic film 200 is formed on the first surface 250A of the optical flexible substrate 250 via the insulative layer 202, and the patterned metal layer 203 in the first bonding region 210 and the patterned metal layer 203 in the second bonding region 220 are exposed. The insulative layer 202 may be made from a dielectric material for example but not limited to polyimide, and may have a thickness of for example but not limited to 3~70 µm. The patterned metal layer 203 may be made of a metal with a high conductivity such as copper, nickel, gold or aluminum, and may have a thickness of for example but not limited to 0.5~30 µm. The cover layer 204, may be made from materials for example but not limited to polyimide, polyester (PET), photoimageable polymers or dielectric materials in the absence or in the presence of an adhesive such as a pressure sensitive adhesive (PSA), an epoxy adhesive or an acrylic adhesive, and may have a thickness of for example but not limited to 5~50 µm.

As shown in FIGS. 1A~1B, the hybrid multi-layered optical flexible printed circuit device 100 further comprises a first connection window 500 formed throughout the intrinsic film 200, the optical flexible substrate 250 and the optical waveguide film 300 to expose part of the first metal traces 401 of the first flexible printed circuit board 400, such that power, high-speed electrical signals and low-speed electrical signals can be coupled between the first flexible printed circuit board 400 and input/output ports, respectively.

As shown in FIGS. 1A~1B, the optical waveguide film 300 comprises an upper cladding layer 301, a lower cladding layer 303 and a waveguide core layer 302 sandwiched therebetween, and the first notch 310 and the second notch 320 are throughout the lower cladding layer 303, the waveguide core layer 302 and part of the upper cladding layer 301, and the optical waveguide film 300 is formed on the second surface 250B of the optical flexible substrate 250 and encompassed the first open window 307 and the second open window 308 via the upper cladding layer 301. The upper cladding layer 301, the waveguide core layer 302 and the lower cladding layer 303 can be made from a material for example but not limited to a photosensitive polyimide resin or an epoxy resin with a refractive index of 1.45~1.65 and a thickness of 20~60 µm. The optical waveguide film 300 is configured as transmission paths for optical intensity signals, especially for high-speed optical intensity signals.

As shown in FIGS. 1A~1B, wherein the optical flexible substrate 250 is formed by a material selected from one of a group consisting of a polyimide, a metal and a liquid crystal polymer (LOP).

As shown in FIGS. 1A~1B, the first optoelectronic device 206A is an optical signal emitting device used to convert electronic signals into optical intensity signals and emit into the waveguide film 300 thereafter, and the second optoelectronic device 206B is an optical signal receiving device used to convert optical signal received from the waveguide film 300 into electronic signals. The first optoelectronic device 206A can be for example but not limited to a VCSEL (Vertical-Cavity Surface-Emitting Laser) or a PD (Photo Diode), and the second optoelectronic device 206B can be for example but not limited to a VCSEL (Vertical-Cavity Surface-Emitting Laser) receiver or a PD (Photo Diode) receiver. The first optoelectronic device 206A and the second optoelectronic device 206B maybe respectively flip-chip mounted on the patterned layer 203 in the first bonding region 210 and the second bonding region 220 through the bonding pads 207 thereof, and preferably mounted on the patterned layer 203 with a surface finishing layer (not shown) formed via electroplating or electroless plating thereon in the first bonding region 210 and the second bonding region 220 to enhance the bonding affinity between the first optoelectronic device 206A, the second optoelectronic device 206B and the patterned metal layer 203.

The first flexible printed circuit board 400 including first metal traces 401 shown in FIGS. 1A~1B provides a flexible layout platform configured for auxiliary connections for example but not limited to high-speed electrical signals (data signals), low-speed electrical signals (control signals) or power (DC/AC Volt), which can be a single-layered flexible printed circuit board, a double-layered flexible printed circuit board, or a multi-layered flexible printed circuit board.

As shown in FIGS. 1A~1B, the first slant surface 315 of the first notch 310 has an included angle θ1 ranging between 25 degree and 75 degree and preferably has an included angle θ1 of 45 degree, and the second slant surface 325 of the second notch 320 has an included angle θ2 ranging between 25 degree and 75 degree and preferably has an included angle θ2 of 45 degree. The first slant surface 315 of the first notch 310 is configured as an optical reflector, such that the optical intensity signals emitted by the first optoelectronic device 206A can be vertically inclined and coupled to the waveguide core layer 302, and the optical intensity signals from the waveguide core layer 302 can be further vertically inclined by the second notch 320 configured as another optical reflector to make the optical intensity signals received by the second optoelectronic device 206B.

As shown in FIGS. 1A~1B, the first flexible printed circuit board 400 was formed on the optical waveguide film 300 via a first adhesive layer 405. According to other embodiments of this invention, the first flexible printed circuit board 400 can also alternatively be formed on the optical waveguide film 300 via a first anisotropic conductive film (not shown), and/or first solder balls (not shown), and/or first metal bumps (not shown), and even in combination with the first adhesive layer 405.

The manufacturing method of the hybrid multi-layered optical flexible printed circuit device 100 as shown in FIGS. 1A~1B will be explained as follows accompanying with FIG. 2 and FIGS. 3A~3C, 4A~4D, 5A~5C and 6.

Figure 2:
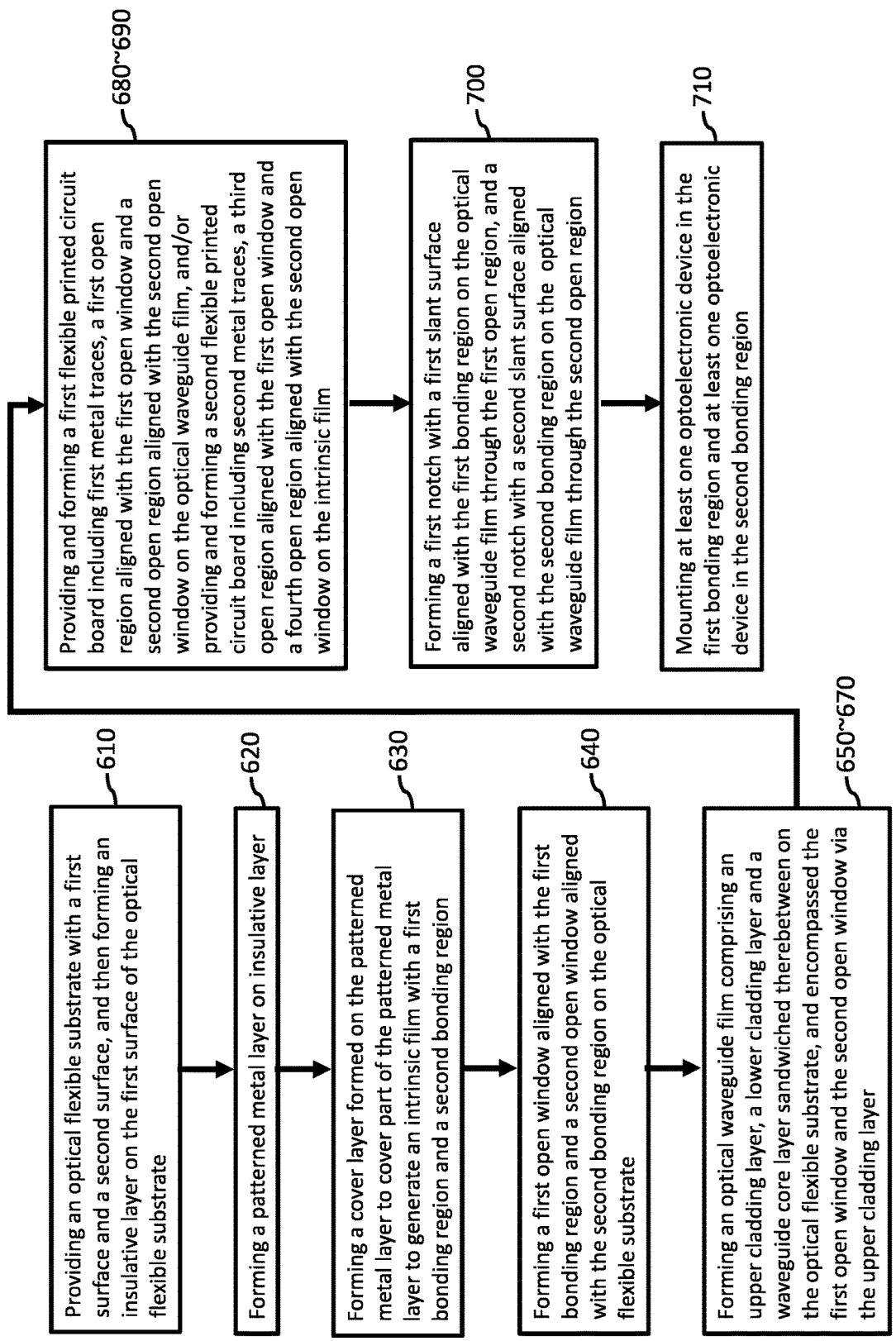
FIG. 2 are flowcharts illustrating steps of a manufacturing method of the hybrid multi-layered optical flexible printed circuit device according to Embodiments of this invention.
Figure 3A:
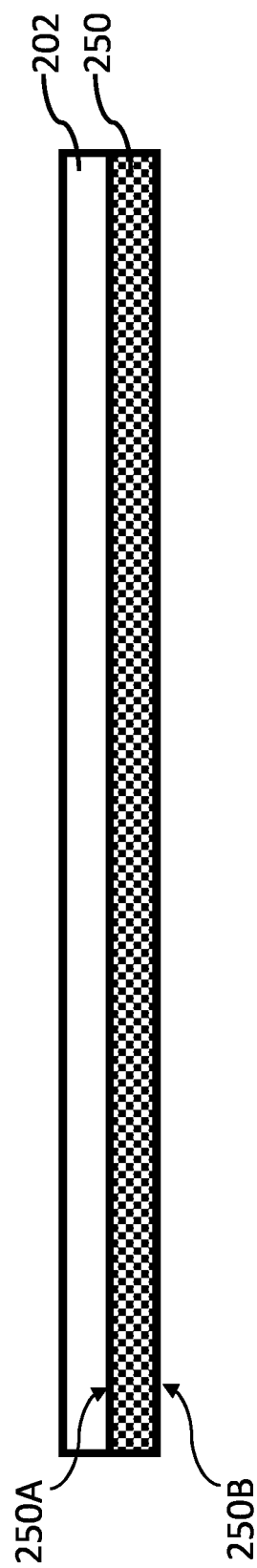
FIGS. 3A~3C are schematic cross-sectional views of steps 610~630 shown in FIG. 2 for manufacturing the hybrid multi-layered optical flexible printed circuit device 100 according to Embodiment 1 of this invention.
Figure 3B:
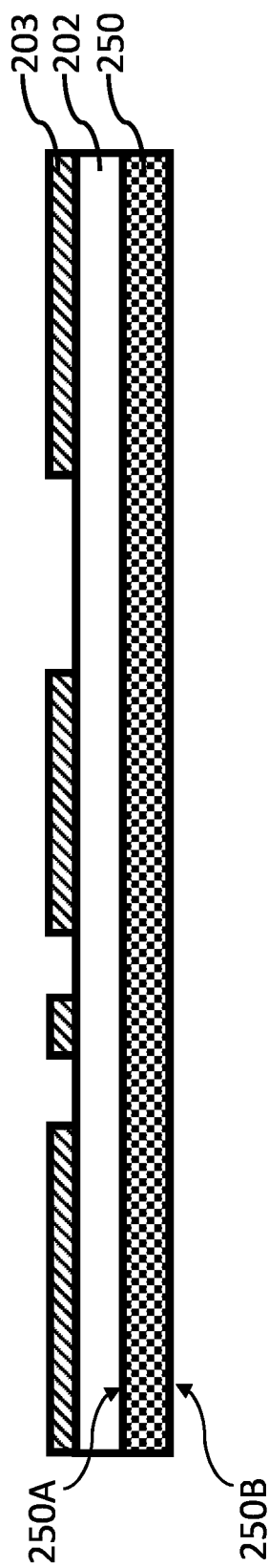
Figure 3C:
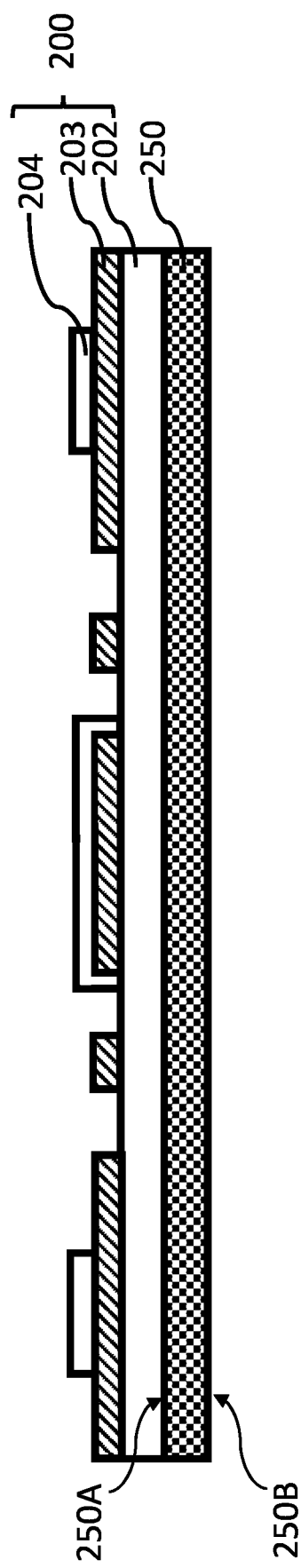

Please refer FIG. 2 and FIGS. 3A~3C. First, referring to FIG. 3A, illustrating the step 610 of the manufacturing method shown in FIG. 2, an optical flexible substrate 250 with a first surface 250A and a second surface 250B was provided, and then an insulative layer 202 was formed on the first surface 250A of the optical flexible substrate 250 by conventional deposition or printing and patterned by photography and etching techniques. The optical flexible substrate 250 can be formed by for example but not limited to a material selected from one of a group consisting of a polyimide, a metal and a liquid crystal polymer (LOP). Next, referring to FIG. 3B, illustrating the step 620 of the manufacturing method shown in FIG. 2, a patterned metal layer 203 made of for example but not limited to copper, nickel, gold or aluminum was formed on the insulative layer 202 by electroplating or sputtering. A specific pattern defined by a photolithography or printing technique is transferred to the patterned metal layer via an etching technique, and is configured as a patterned metal layer 203, e.g. bonding pad, GND pad, power wire, control signal wire or transmission wire. Next, referring to FIG. 3C, illustrating the step 630 of the manufacturing method shown in FIG. 2, a cover layer 204 was formed on the patterned metal layer 203 to cover part of the patterned metal layer 203 by conventional deposition or printing and patterned by photography and etching techniques to generate an intrinsic 200 with a first bonding region 210 and a second bonding region 220 formed on the first surface 250A of the optical flexible substrate 250. The insulative layer 202 may be made from a dielectric material for example but not limited to polyimide, and may have a thickness of for example but not limited to 3~70 µm. The patterned metal layer 203 may be made of a metal with a high conductivity such as copper, nickel, gold or aluminum, and may have a thickness of for example but not limited to 0.5~30 µm. The cover layer 204, may be made from materials for example but not limited to polyimide, polyester (PET), photoimageable polymers or dielectric materials in the absence or in the presence of an adhesive such as a pressure sensitive adhesive (PSA), an epoxy adhesive or an acrylic adhesive, and may have a thickness of for example but not limited to 5~50 µm.

Figure 4A:
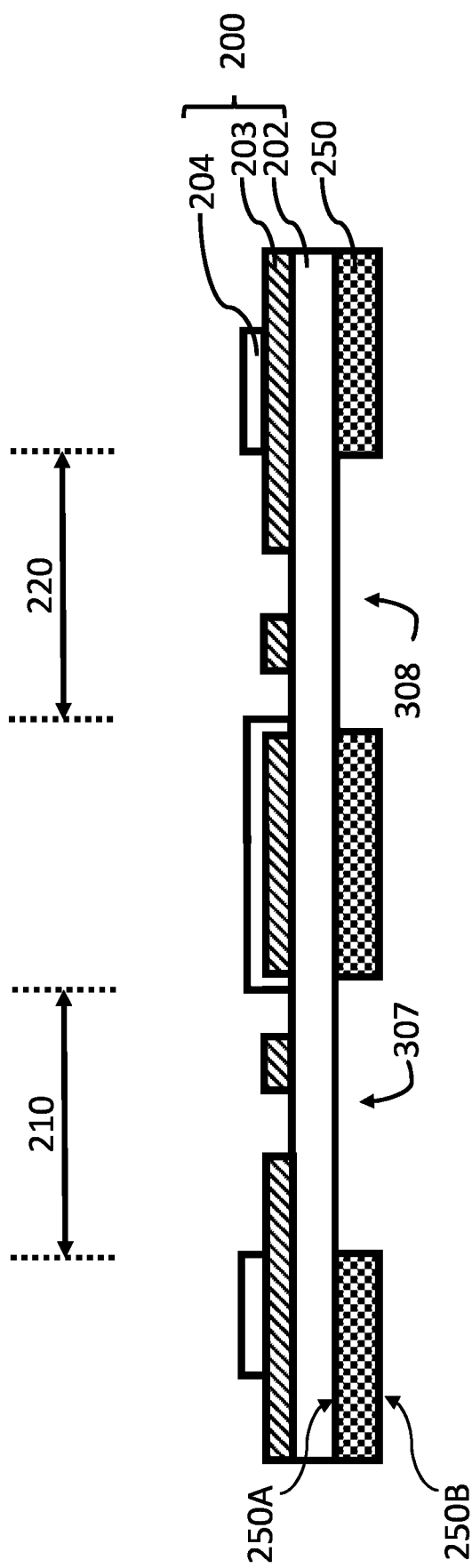
FIGS. 4A~4D are schematic cross-sectional views of steps 640~670 shown in FIG. 2 for manufacturing the hybrid multi-layered optical flexible printed circuit device 100 according to Embodiment 1 of this invention.
Figure 4B:
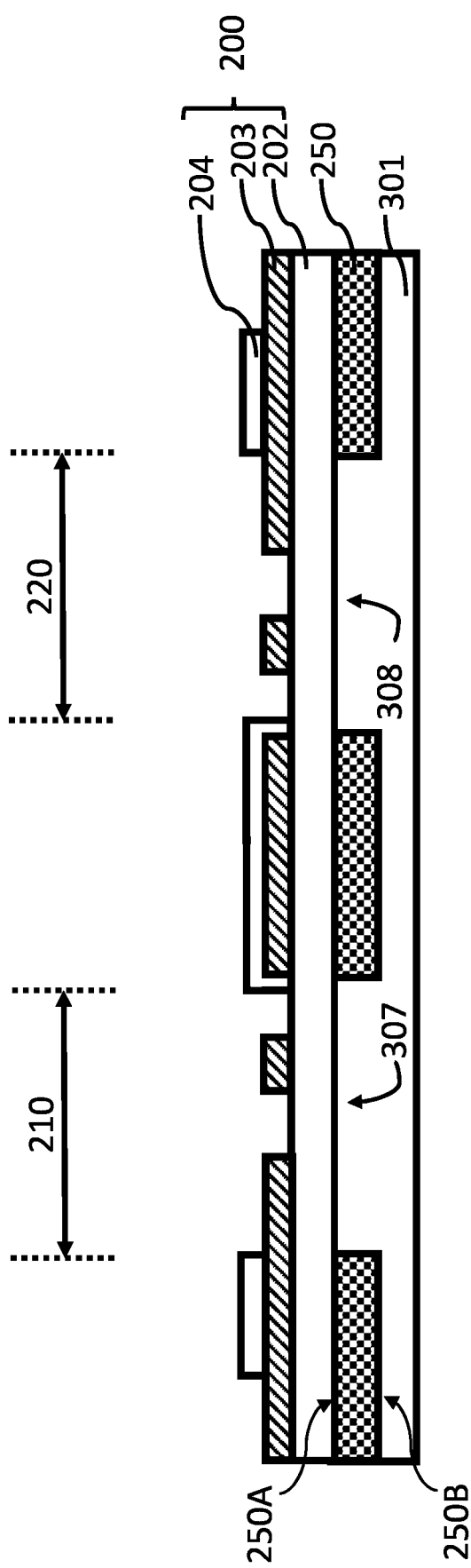
Figure 4C:
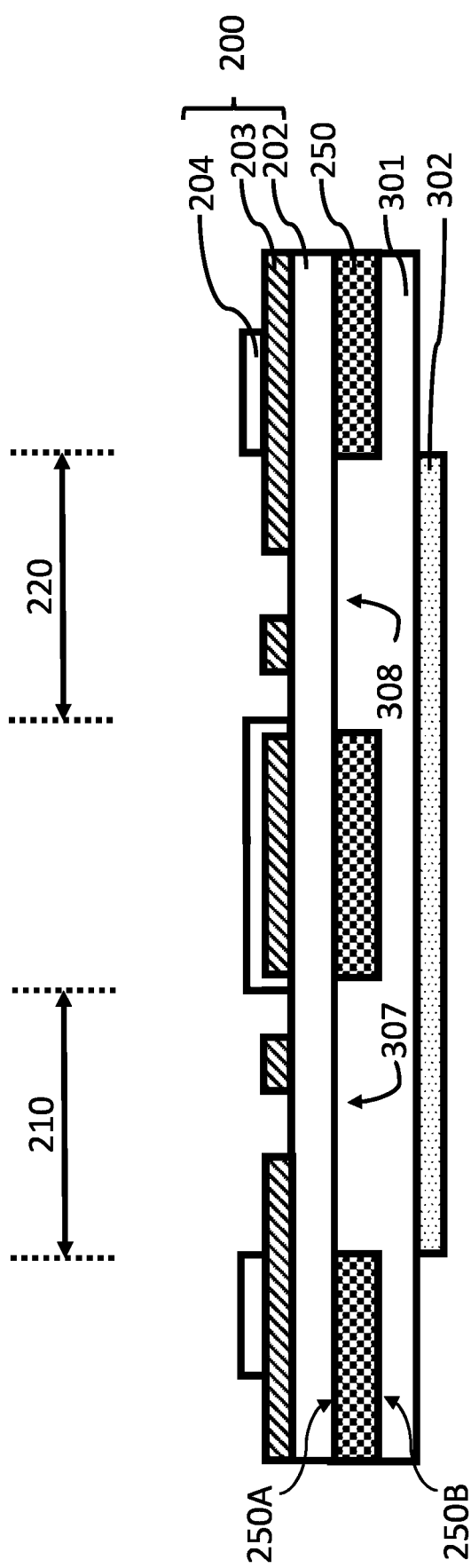
Figure 4D:
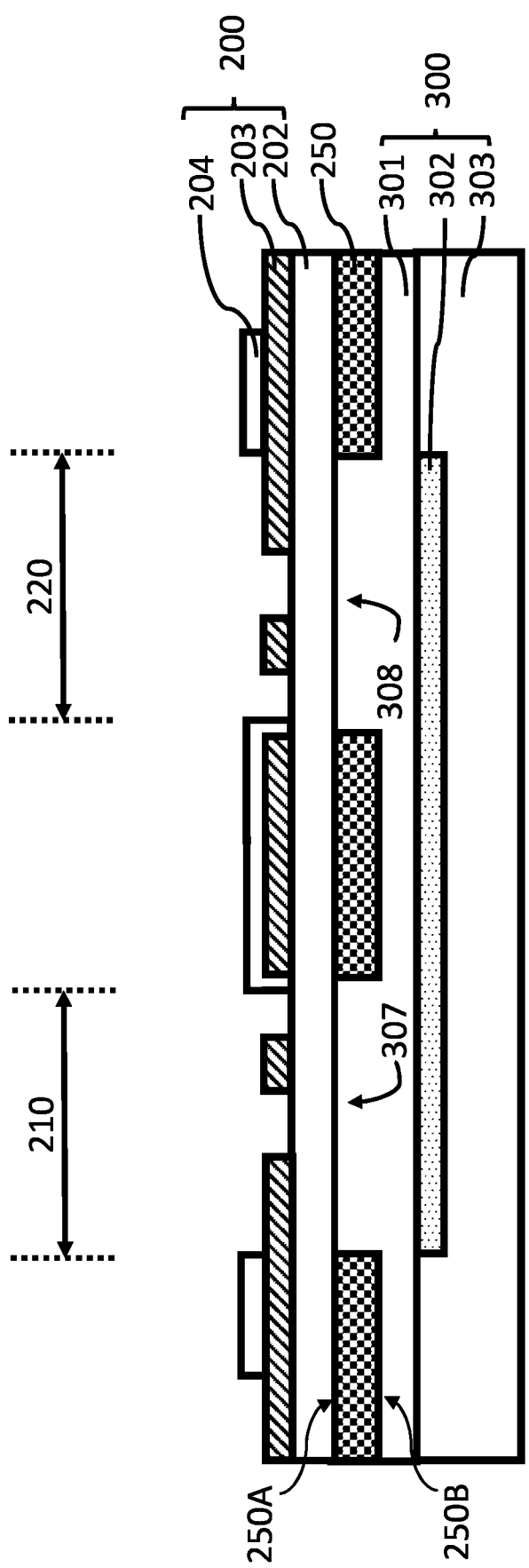

Next, referring to FIG. 4A, illustrating the step 640 of the manufacturing method shown in FIG. 2, a first open window 307 aligned with the first bonding region 210 and a second open window 308 aligned with the second bonding region 220 were formed on the optical flexible substrate 250 by dry or wet etching techniques. Next, referring to FIG. 4B, illustrating the step 650 of the manufacturing method shown in FIG. 2, an upper cladding layer 301 was formed on the second surface 250B of the optical flexible substrate 250 and encompassed the first open window 307 and the second open window 308 by photolithography, printing or other techniques common in the art. Next, referring to FIG. 4C, illustrating the step 660 of the manufacturing method shown in FIG. 2, a waveguide core layer 302 was formed on a side of the upper cladding layer 301 opposite to the optical flexible substrate 250 by photolithography, printing or other techniques common in the art. The waveguide core layer 302 can be patterned by photography, etching or other techniques common in the art. Next, referring to FIG. 4D, illustrating the step 670 of the manufacturing method shown in FIG. 2, a lower cladding layer 303 was formed on a side of the upper cladding layer 301 and the waveguide core layer 302 opposite to the optical flexible substrate 250 by photolithography, printing or other techniques common in the art to generate an optical waveguide film 300 formed on the second surface 250B of the optical flexible substrate 250 and encompassed the first open window 307 and the second open window 308. The upper cladding layer 301, the waveguide core layer 302 and the lower cladding layer 303 can be made from a material for example but not limited to a photosensitive polyimide resin or an epoxy resin with a refractive index of 1.45~1.65 and a thickness of 20~60 µm.

Figure 5A:
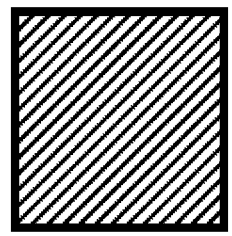
FIGS. 5A~5C are schematic cross-sectional views of steps 680~700 shown in FIG. 2 for manufacturing the hybrid multi-layered optical flexible printed circuit device 100 according to Embodiment 1 of this invention.
Figure 5A:
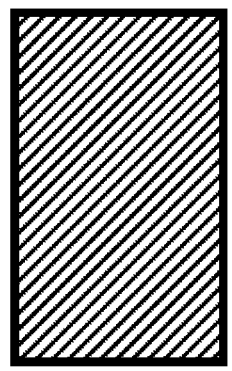
Figure 5A:
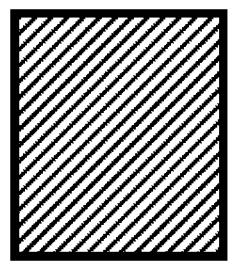
Figure 5B:
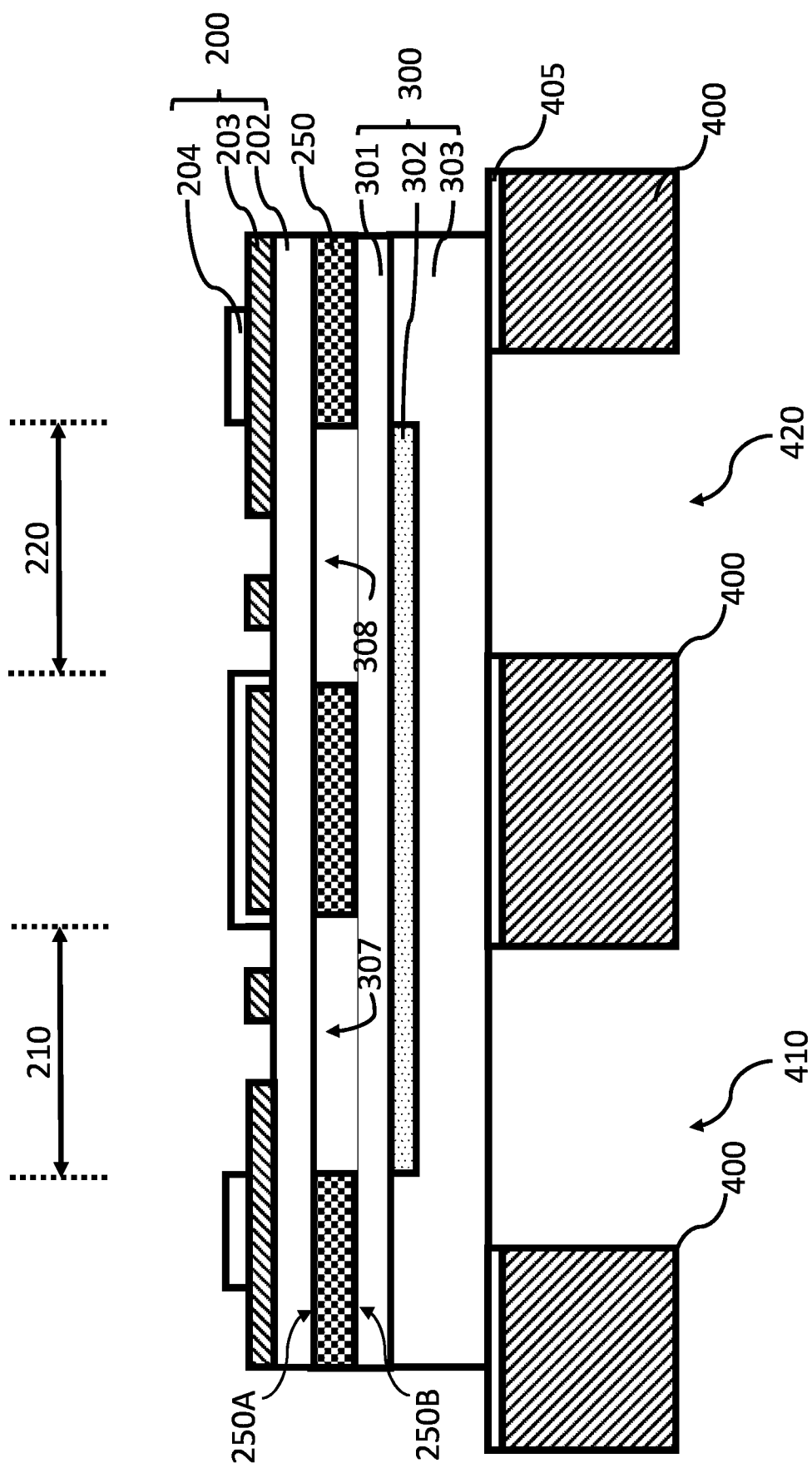
Figure 5C:
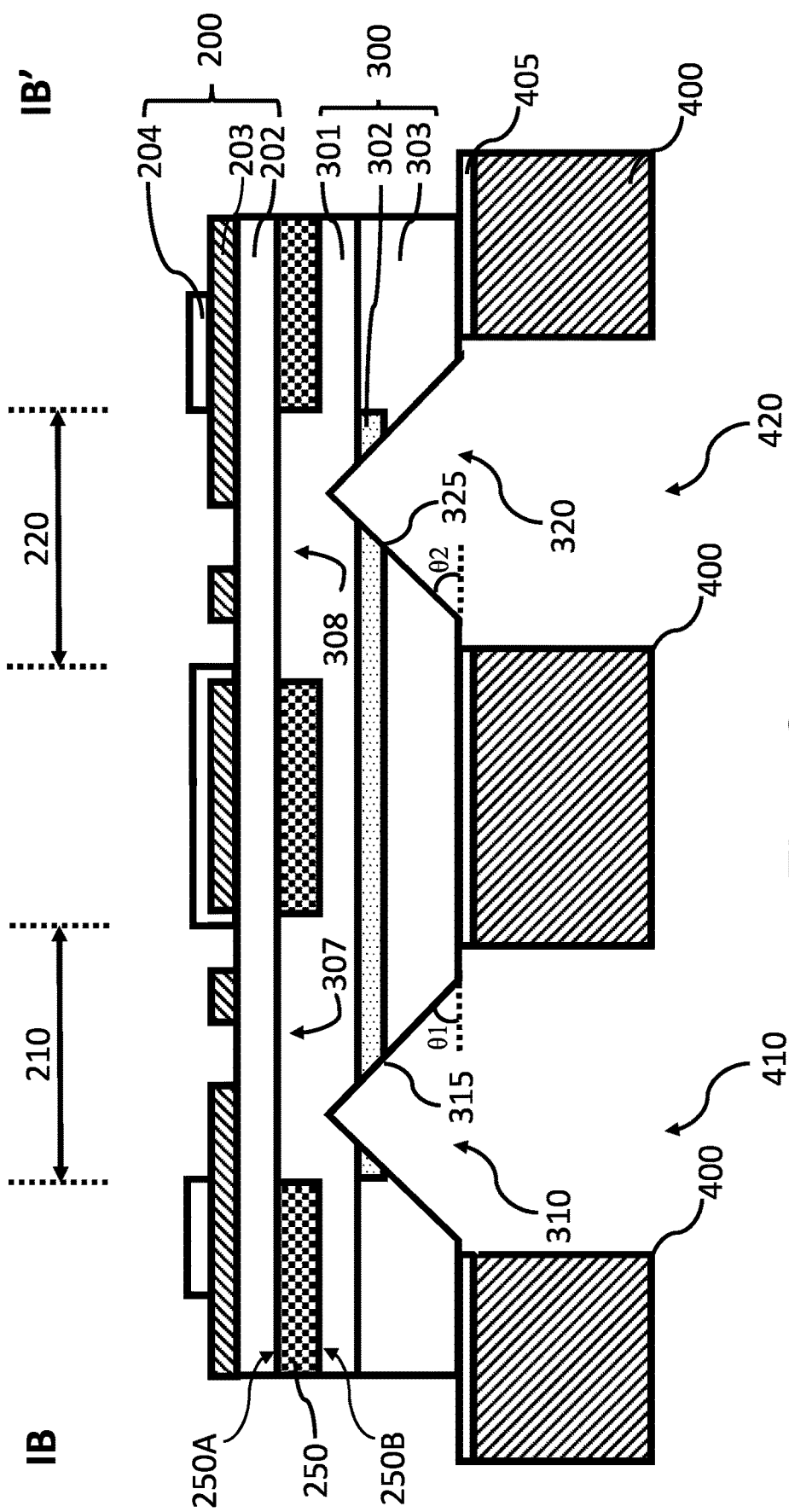

Next, referring to FIG. 5A, illustrating the step 680 of the manufacturing method shown in FIG. 2, a first flexible printed circuit board 400 including first metal traces 401, a first open region 410 aligned with the first open window 307 and a second open region 420 aligned with the second open window 308 was provided. Next, referring to FIG. 5B, illustrating the step 690 of the manufacturing method shown in FIG. 2, the first flexible printed circuit board 400 was formed on the lower cladding layer 303 of the optical waveguide film 300 via an adhesive layer 405. According to other embodiments of this invention, the first flexible printed circuit board 400 can also alternatively be formed on the lower cladding layer 330 of the optical waveguide film 300 via a first anisotropic conductive film (not shown), and/or first solder balls (not shown), and/or first metal bumps (not shown), and even in combination with the first adhesive layer 405. Next, referring to FIG. 5C, illustrating the step 700 of the manufacturing method shown in FIG. 2, a first notch 310 with a first slant surface 315 aligned with the first bonding region 210 was formed on the optical waveguide film 300 by for example but not limited to laser cutting or mechanical cutting through the first open region 410, and a second notch 320 with a second slant surface 325 aligned with the second bonding region 220 was formed on the optical waveguide film 300 by for example but not limited to laser cutting or mechanical cutting through the second open region 420. The first notch 310 and the second notch 320 were both throughout the lower cladding layer 303, the waveguide core layer 302 and part of the upper cladding layer 301. The first slant surface 315 of the first notch 310 has an included angle θ1 ranging between 25 degree and 75 degree and preferably has an included angle θ1 of 45 degree, and the second slant surface 325 of the second notch 320 has an included angle θ2 ranging between 25 degree and 75 degree and preferably has an included angle θ2 of 45 degree.

As mentioned above, the first flexible printed circuit board 400 shown in FIGS. 1A~1B can be a single-layered flexible printed circuit board, a double-layered flexible printed circuit board, or a multi-layered flexible printed circuit board.

Figure 6:
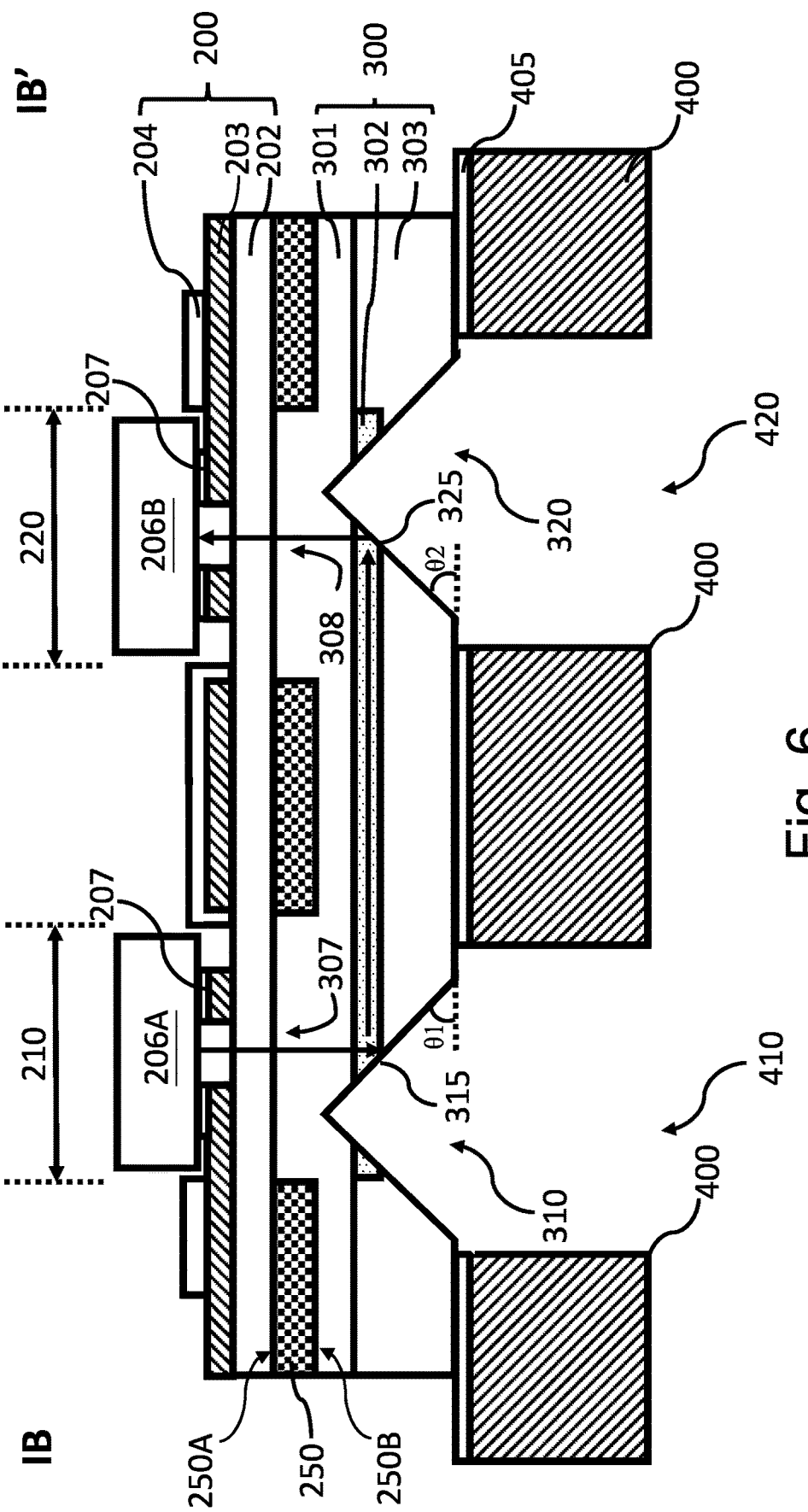
FIG. 6 is a schematic cross-sectional view of step 710 shown in FIG. 2 for manufacturing the hybrid multi-layered optical flexible printed circuit device 100 according to Embodiment 1 of this invention.

Finally, referring to FIG. 6, illustrating the step 710 of the manufacturing method shown in FIG. 2, a first optoelectronic device 206A and a second optoelectronic device 206B were respectively bonded on the patterned metal layer 203 in the first bonding region 210 and the second bonding region 220 to generate a hybrid multi-layered optical flexible printed circuit device 100 as shown in FIGS. 1A~1B. As mentioned above, the first optoelectronic device 206A is an optical signal emitting device used to convert electronic signals into optical intensity signals and emit into the waveguide film 300 thereafter, and the second optoelectronic device 206B is an optical signal receiving device used to convert optical signal received from the waveguide film 300 into electronic signals. The first optoelectronic device 206A can be for example but not limited to a VCSEL (Vertical-Cavity Surface-Emitting Laser) or a PD (Photo Diode), and the second optoelectronic device 206B can be for example but not limited to a VCSEL (Vertical-Cavity Surface-Emitting Laser) receiver or a PD (Photo Diode) receiver. The first optoelectronic device 206A and the second optoelectronic device 206E maybe respectively flip-chip mounted on the patterned layer 203 in the first bonding region 210 and the second bonding region 220 through the bonding pads 207 thereof, and preferably mounted on the patterned layer 203 with a surface finishing layer (not shown) formed via electroplating or electroless plating thereon via electroplating or electroless plating techniques in the first bonding region 210 and the second bonding region 220 to enhance the bonding affinity between the first optoelectronic device 206A, the second optoelectronic device 206E and the patterned metal layer 203.

Embodiment 2

A hybrid multi-layered optical flexible printed circuit device 100' according to Embodiment 2 of this invention as shown in FIGS. 1A'~1C' is disclosed, which was manufactured by the steps illustrated in the flowcharts shown in FIG. 2.

Figure 1C:
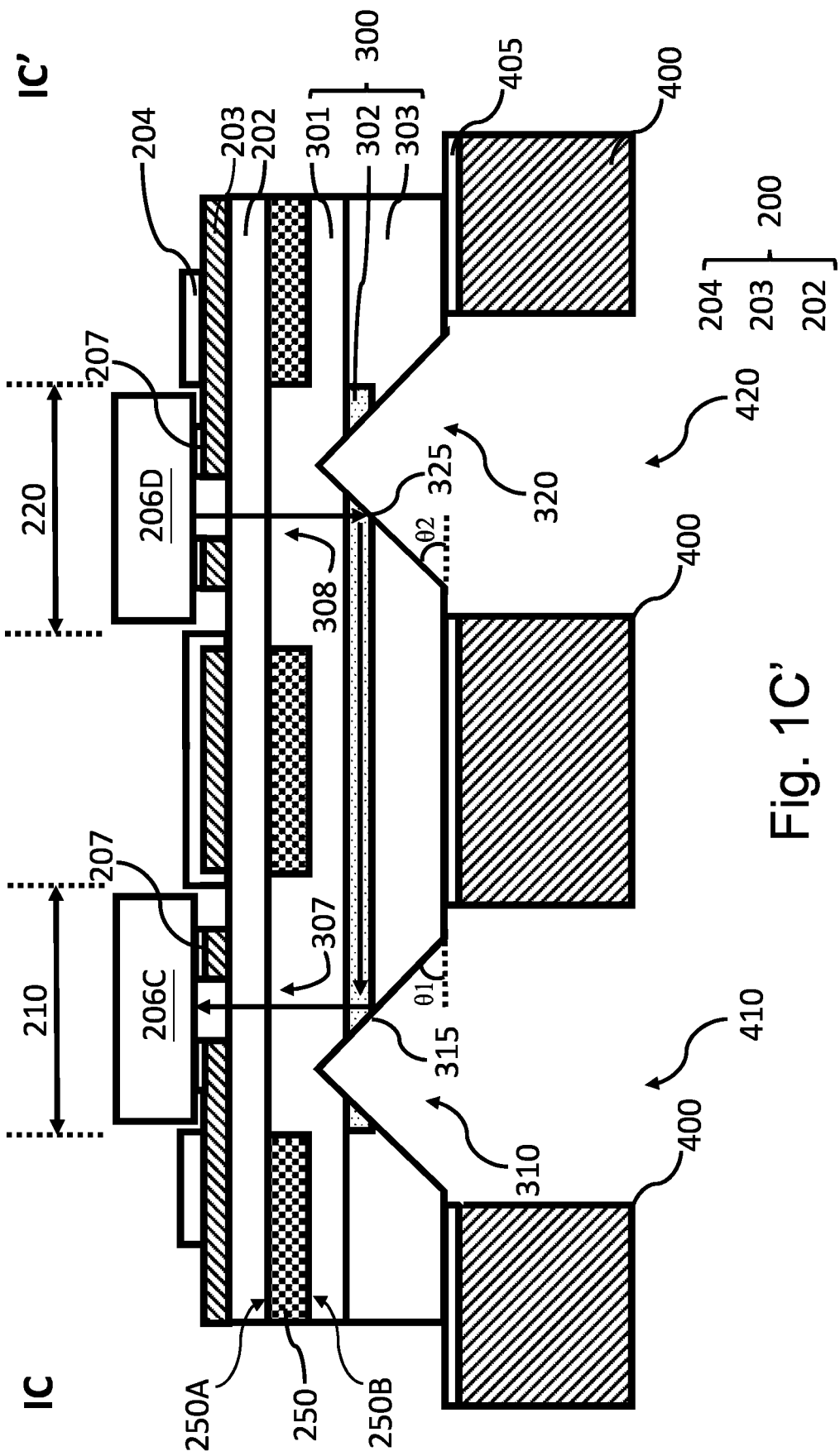
FIG. 1C' is a schematic cross-sectional view of the hybrid multi-layered optical flexible printed circuit device 100' according to Embodiment 2 of this invention along with the cross-sectional line IC-IC' shown in FIG. 1A'.

Please refer to FIGS. 1A'~1C' and FIG. 2. FIG. 1A' is a schematic top view of a hybrid multi-layered optical flexible printed circuit device 100' according to Embodiment 2 of this invention. FIG. 1B' is a schematic cross-sectional view of the hybrid multi-layered optical flexible printed circuit device 100' according to Embodiment 2 of this invention along with the cross-sectional line IB-IB' shown in FIG. 1A'. FIG. 1C' is a schematic cross-sectional view of the hybrid multi-layered optical flexible printed circuit device 100' according to Embodiment 2 of this invention along with the cross-sectional line IC-IC' shown in FIG. 1A'. As shown in FIGS. 1A'~1C', the structure of the hybrid multi-layered optical flexible printed circuit device 100' according to Embodiment 2 of this invention is similar to that of the hybrid multi-layered optical flexible printed circuit device 100 according to Embodiment 1 of this invention as shown in FIGS. 1A~1B except that the hybrid multi-layered optical flexible printed circuit device 100' further comprises a third optoelectronic device 206C and a fourth optoelectronic device 206D respectively mounted on the patterned metal layer 203 in the first bonding region 210 and the second bonding region 220, and the optical intensity signals emitted by the fourth optoelectronic device 206D is received by the third optoelectronic device 206C through the waveguide core layer 302 of the optical waveguide film 300.

As shown in FIGS. 1A'~1C', and FIG. 2, a first optoelectronic device 206A and a third optoelectronic device 206C were respectively mounted on the patterned metal layer 203 in the first bonding region 210, and a second optoelectronic device 206B and a fourth optoelectronic device 206D were respectively mounted on the patterned metal layer 203 in the second bonding region 220 in step 710 of the manufacturing method shown in FIG. 2. The fourth optoelectronic device 206D is an optical signal emitting device used to convert electronic signals into optical intensity signals and emit into the waveguide film 300 thereafter, and the third optoelectronic device 206C is an optical signal receiving device used to convert optical intensity signals received from the waveguide film 300 into electrical signals. The fourth optoelectronic device 206D can be for example but not limited to a VCSEL (Vertical-Cavity Surface-Emitting Laser) or a PD (Photo Diode), and the third optoelectronic device 206C can be for example but not limited to a VCSEL (Vertical-Cavity Surface-Emitting Laser) receiver or PD (Photo Diode) receiver. The second slant surface 325 of the second notch 320 is also configured as an optical reflector, such that the optical intensity signals emitted by the fourth optoelectronic device 206D can be vertically inclined and coupled to the waveguide core layer 302, and the optical intensity signals from the waveguide core layer 302 can be further vertically inclined by the first notch 310 configured as another optical reflector to make the optical intensity signals received by the third optoelectronic device 206C.

Similarly, the third optoelectronic device 206C and the fourth optoelectronic device 206D maybe respectively flip-chip mounted on the patterned layer 203 in the first bonding region 210 and the second bonding region 220 through the bonding pads 207 thereof, and preferably mounted on the patterned layer 203 with a surface finishing layer (not shown) formed via electroplating or electroless plating thereon in the first bonding region 210 and the second bonding region 220 to enhance the bonding affinity between the third optoelectronic device 206C, the fourth optoelectronic device 206D and the patterned metal layer 203.

Similarly, the first flexible printed circuit board 400 including first metal traces 401 shown in FIGS. 1A'~1C' provides a flexible layout platform configured for auxiliary connections for example but not limited to high-speed electrical signals (data signals), low-speed electrical signals (control signals) or power (DC/AC Volt).

Embodiment 3

Figure 7A:
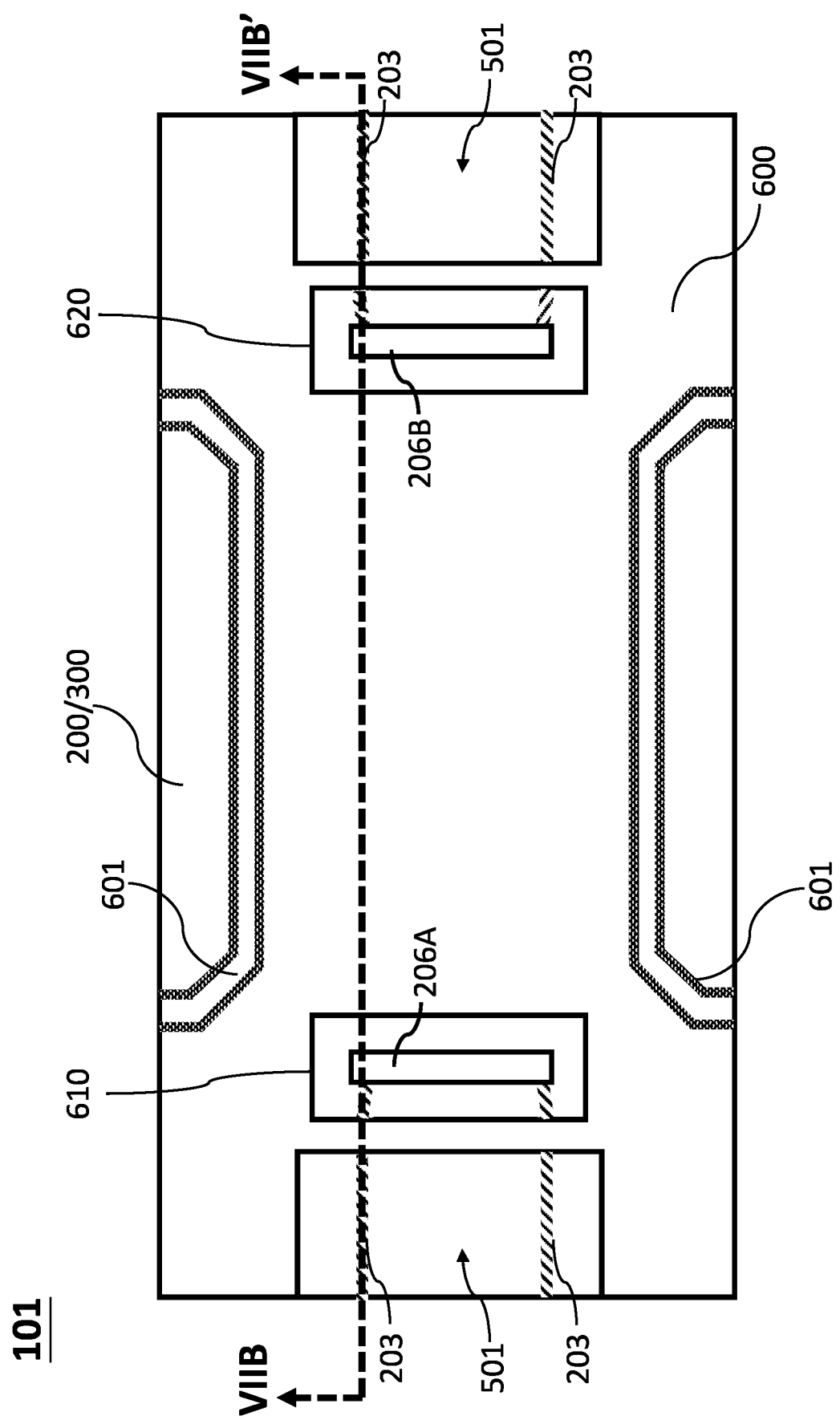
FIG. 7A is a schematic top view of a hybrid multi-layered optical flexible printed circuit device 101 according to Embodiment 3 of this invention.
Figure 7A:
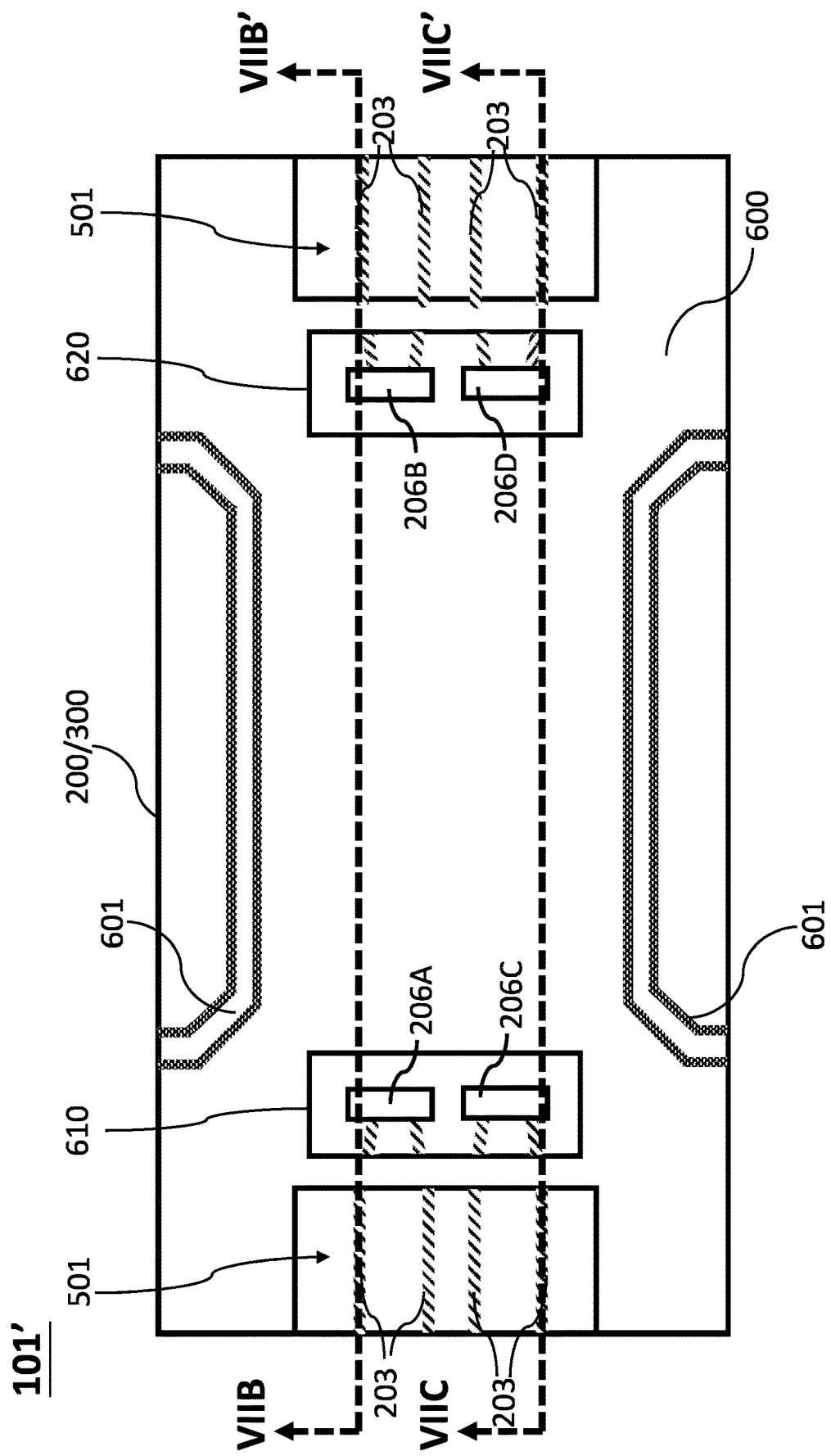
Figure 7B:
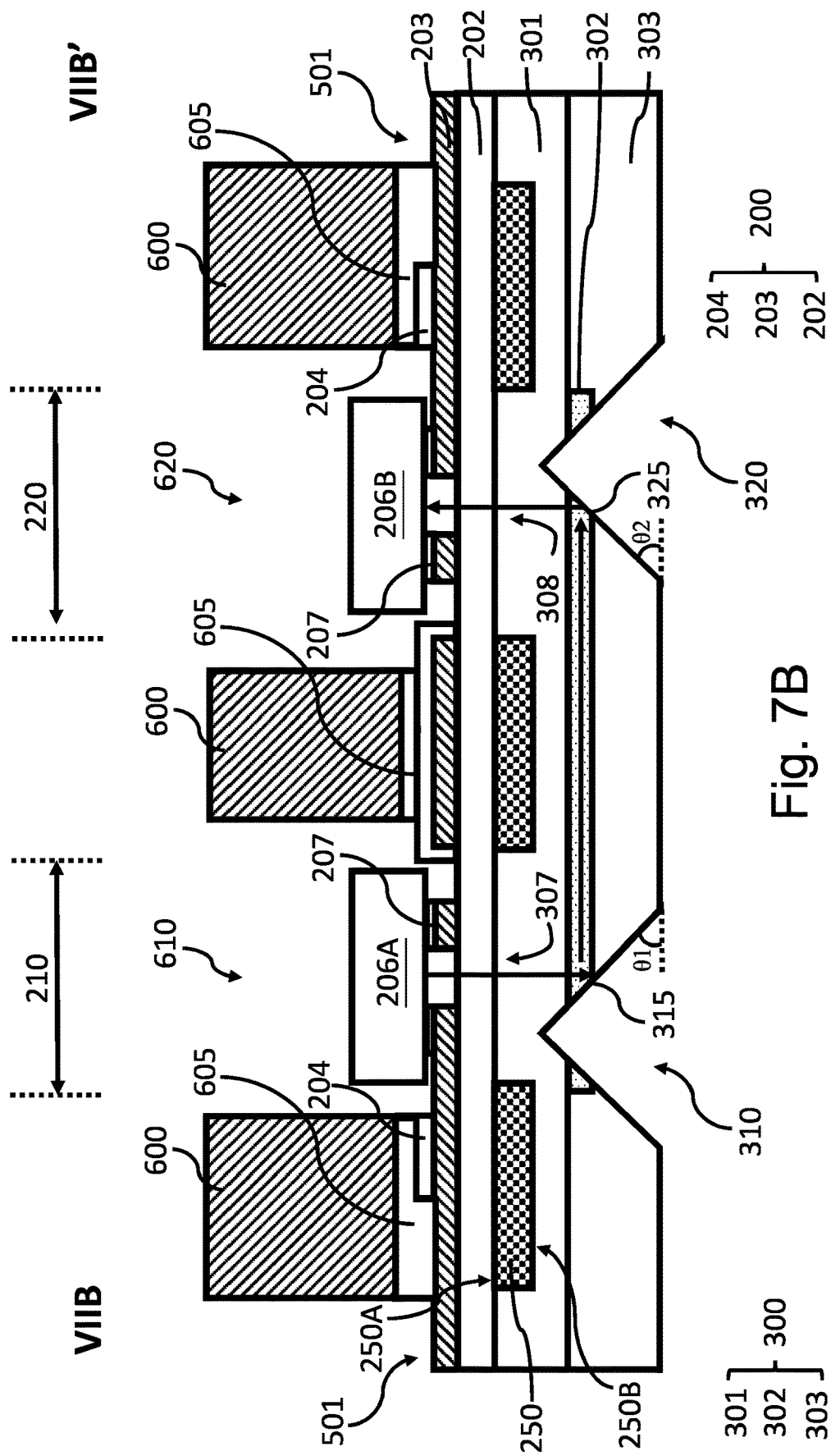
FIG. 7B is a schematic cross-sectional view of the hybrid multi-layered optical flexible printed circuit device 101 according to Embodiment 3 of this invention along with the cross-sectional line VIIB-VIIB' shown in FIG. 7A.
Figure 7B:
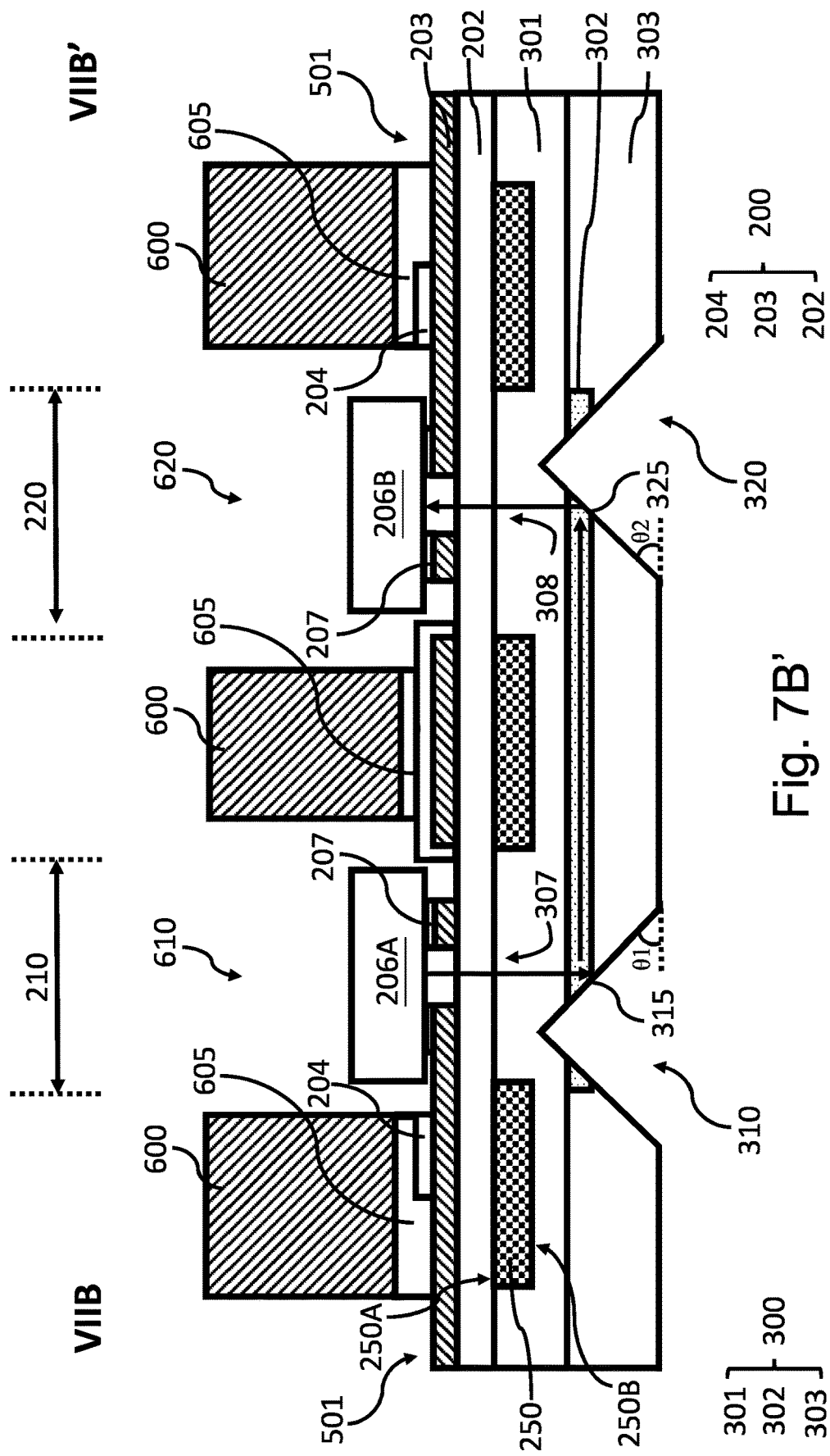

A hybrid multi-layered optical flexible printed circuit device 101 according to Embodiment 3 of this invention as shown in FIGS. 7A~7B is disclosed, which was manufactured by the steps illustrated in the flowcharts shown in FIG. 2.

Please refer to FIGS. 7A~7B and FIG. 2. FIG. 7A is a schematic top view of a hybrid multi-layered optical flexible printed circuit device 101 according to Embodiment 3 of this invention. FIG. 7B is a schematic cross-sectional view of the hybrid multi-layered optical flexible printed circuit device 101 according to Embodiment 3 of this invention along with the cross-sectional line VIIB-VIIB' shown in FIG. 7A. As shown in FIGS. 7A~7B, the structure of the hybrid multi-layered optical flexible printed circuit device 101 according to Embodiment 3 of this invention is similar to that of the hybrid multi-layered optical flexible printed circuit device 100 according to Embodiment 1 of this invention as shown in FIGS. 1A~1B except that a second flexible printed circuit board 600 including second metal traces 601, a third open region 610 aligned with the first open window 307 and a fourth open region 620 aligned with the second open window 308 was provided to replace the first flexible printed circuit board 400 and form on the intrinsic film 200 in the steps 680~690 of the manufacturing method shown in FIG. 2. The second flexible printed circuit board 600 including second metal traces 601 provides a flexible layout platform configured for auxiliary connections for example but not limited to high-speed electrical signals (data signals), low-speed electrical signals (control signals) or power (DC/AC Volt).

The second flexible printed circuit board 600 shown in FIGS. 7A~7B can be a single-layered flexible printed circuit board, a double-layered flexible printed circuit board, or a multi-layered flexible printed circuit board.

As shown in FIGS. 7A~7B, the second flexible printed circuit board 600 was formed on the intrinsic film 200 via a second adhesive layer 605. According to other embodiments of this invention, the second flexible printed circuit board 600 can also alternatively be formed the intrinsic film 200 via a second anisotropic conductive film (not shown), and/or second solder balls (not shown), and/or second metal bumps (not shown), and even in combination with the second adhesive layer 605.

As shown in FIGS. 7A~7B, the hybrid multi-layered optical flexible printed circuit device 101 further comprises a second connection window 501 formed throughout the second flexible printed circuit board 600 to expose part of the patterned metal layer 203 of the intrinsic film 200 such that not only high-speed electrical signals can be linked between the first optoelectronic device 206A, the second optoelectronic device 206B and outside devices (not shown), but also low-speed or power trail can be linked between each end-point of hybrid multi-layered optical flexible printed circuit device 101.

Similarly, as shown in FIGS. 7A~7B, the first optoelectronic device 206A is an optical signal emitting device used to convert electronic signals into optical intensity signals and emit into the waveguide film 300 thereafter, and the second optoelectronic device 206B is an optical signal receiving device used to convert optical intensity signals received from the waveguide film 300 into electrical signals. The first slant surface 315 of the first notch 310 is configured as an optical reflector, such that the optical intensity signals emitted by the first optoelectronic device 206A can be vertically inclined and coupled to the waveguide core layer 302, and the optical intensity signals from the waveguide core layer 302 can be further vertically inclined by the second notch 320 configured as another optical reflector to make the optical intensity signals received by the second optoelectronic device 206B.

Embodiment 4

A hybrid multi-layered optical flexible printed circuit device 101' according to Embodiment 4 of this invention as shown in FIGS. 7A'~7C' is disclosed, which was manufactured by the steps illustrated in the flowcharts shown in FIG. 2.

Figure 7C:
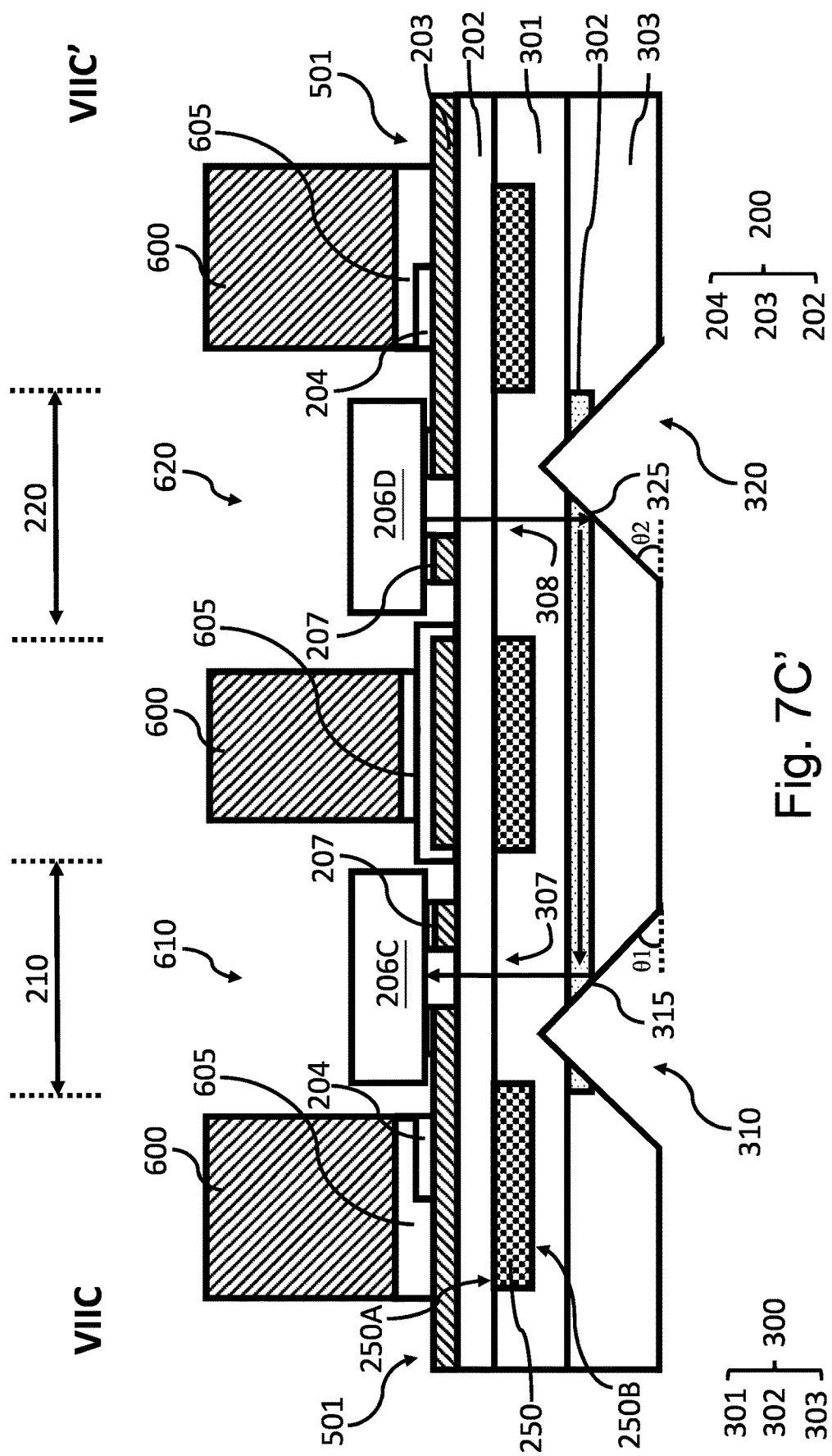
FIG. 7C' is a schematic cross-sectional view of the hybrid multi-layered optical flexible printed circuit device 101' according to Embodiment 4 of this invention along with the cross-sectional line VIIC-VIIC' shown in FIG. 7A'.

Please refer to FIGS. 7A'~7C' and FIG. 2. FIG. 7A' is a schematic top view of a hybrid multi-layered optical flexible printed circuit device 101' according to Embodiment 4 of this invention. FIG. 7B' is a schematic cross-sectional view of the hybrid multi-layered optical flexible printed circuit device 101' according to Embodiment 4 of this invention along with the cross-sectional line VIIB-VIIB' shown in FIG. 7A'. FIG. 7C' is a schematic cross-sectional view of the hybrid multi-layered optical flexible printed circuit device 101' according to Embodiment 4 of this invention along with the cross-sectional line VIIC-VIIC' shown in FIG. 7A'. As shown in FIGS. 7A'~7C', the structure of the hybrid multi-layered optical flexible printed circuit device 101' according to Embodiment 4 of this invention is similar to that of the hybrid multi-layered optical flexible printed circuit device 101 according to Embodiment 3 of this invention as shown in FIGS. 7A~7B except that the hybrid multi-layered optical flexible printed circuit device 101' further comprises a third optoelectronic device 206C and a fourth optoelectronic device 206D respectively mounted on the patterned metal layer 203 in the first bonding region 210 and the second bonding region 220, and the optical intensity signals emitted by the fourth optoelectronic device 206D is received by the third optoelectronic device 206C through the waveguide core layer 302 of the optical waveguide film 300.

As shown in FIGS. 7A'~7C', and FIG. 2, a first optoelectronic device 206A and a third optoelectronic device 206C were respectively mounted on the patterned metal layer 203 in the first bonding region 210, and a second optoelectronic device 206B and a fourth optoelectronic device 206D were respectively mounted on the patterned metal layer 203 in the second bonding region 220 in step 710 of the manufacturing method shown in FIG. 2. The fourth optoelectronic device 206D is an optical signal emitting device used to convert electronic signals into optical intensity signals and emit into the waveguide film 300 thereafter, and the third optoelectronic device 206C is an optical signal receiving device used to convert optical intensity signals received from the waveguide film 300 into electrical signals. The fourth optoelectronic device 206D can be for example but not limited to a VCSEL (Vertical-Cavity Surface-Emitting Laser) or a PD (Photo Diode), and the third optoelectronic device 206C can be for example but not limited to a VCSEL (Vertical-Cavity Surface-Emitting Laser) receiver or a PD (Photo Diode) receiver. The second slant surface 325 of the second notch 320 is also configured as an optical reflector, such that the optical intensity signals emitted by the fourth optoelectronic device 206D can be vertically inclined and coupled to the waveguide core layer 302, and the optical intensity signals from the waveguide core layer 302 can be further vertically inclined by the first notch 310 configured as another optical reflector to make the optical intensity signals received by the third optoelectronic device 206C.

As shown in FIGS. 7A'~7C', the hybrid multi-layered optical flexible printed circuit device 101' the second connection window 501 formed throughout the second flexible printed circuit board 600 to expose part of the patterned metal layer 203 of the intrinsic film 200 high-speed electrical signals such that not only high-speed electrical signals can be linked between the first optoelectronic device 206A, the second optoelectronic device 206B, the third optoelectronic device 206C, the optoelectronic device 206D and outside devices (not shown), but also low-speed or power trail can be linked between each end-point of hybrid multi-layered optical flexible printed circuit device 101'.

Similarly, the third optoelectronic device 206C and the fourth optoelectronic device 206D maybe respectively flip-chip mounted on the patterned layer 203 in the first bonding region 210 and the second bonding region 220 through the bonding pads 207 thereof, and preferably mounted on the patterned layer 203 with a surface finishing layer (not shown) formed via electroplating or electroless plating thereon in the first bonding region 210 and the second bonding region 220 to enhance the bonding affinity between the third optoelectronic device 206C, the fourth optoelectronic device 206D and the patterned metal layer 203.

Similarly, the second flexible printed circuit board 600 shown in FIGS. 7A'~7C' can be a single-layered flexible printed circuit board, a double-layered flexible printed circuit board, or a multi-layered flexible printed circuit board.

Embodiment 5

Figure 8A:
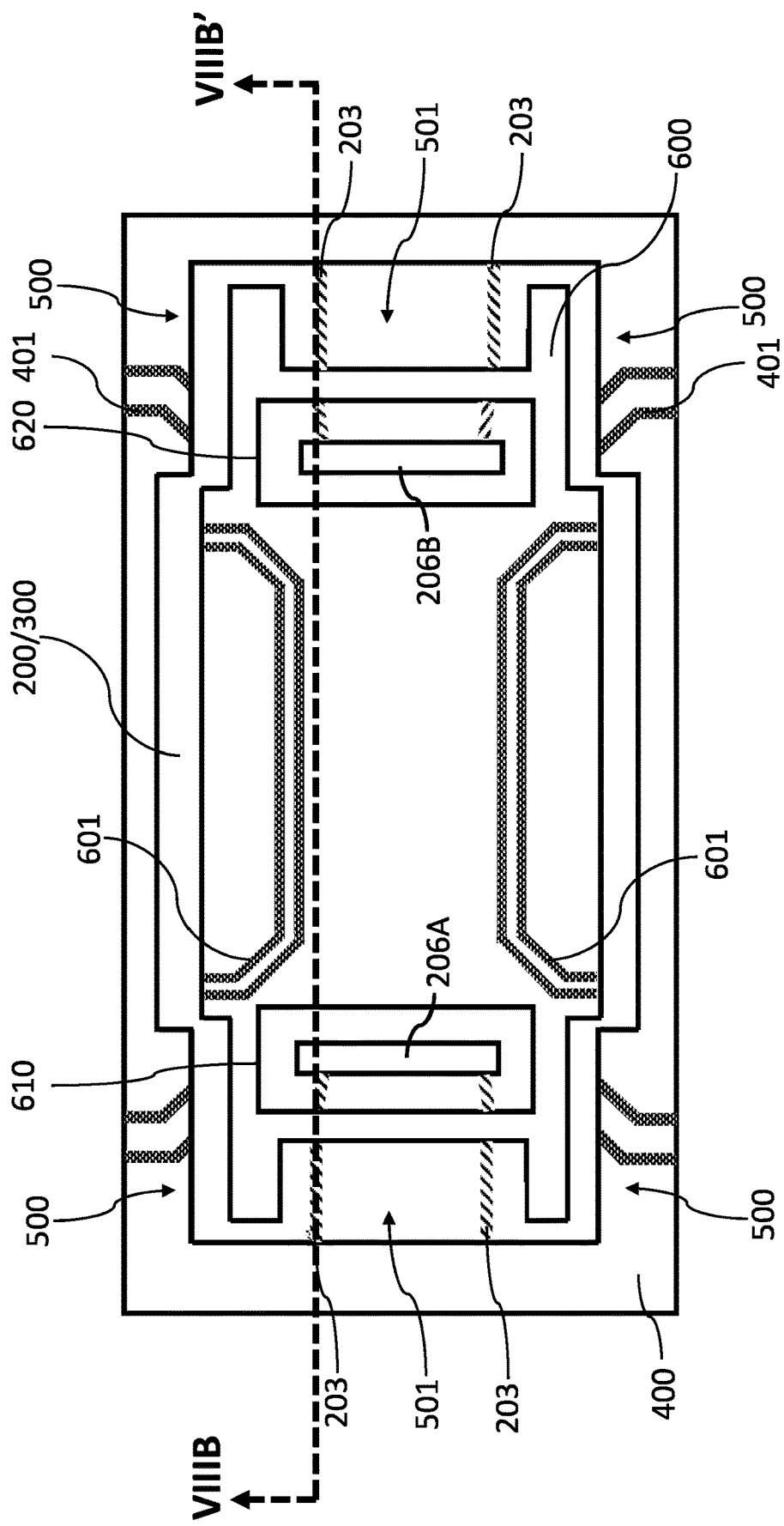
FIG. 8A is a schematic top view of a hybrid multi-layered optical flexible printed circuit device 102 according to Embodiment 5 of this invention.
Figure 8A:
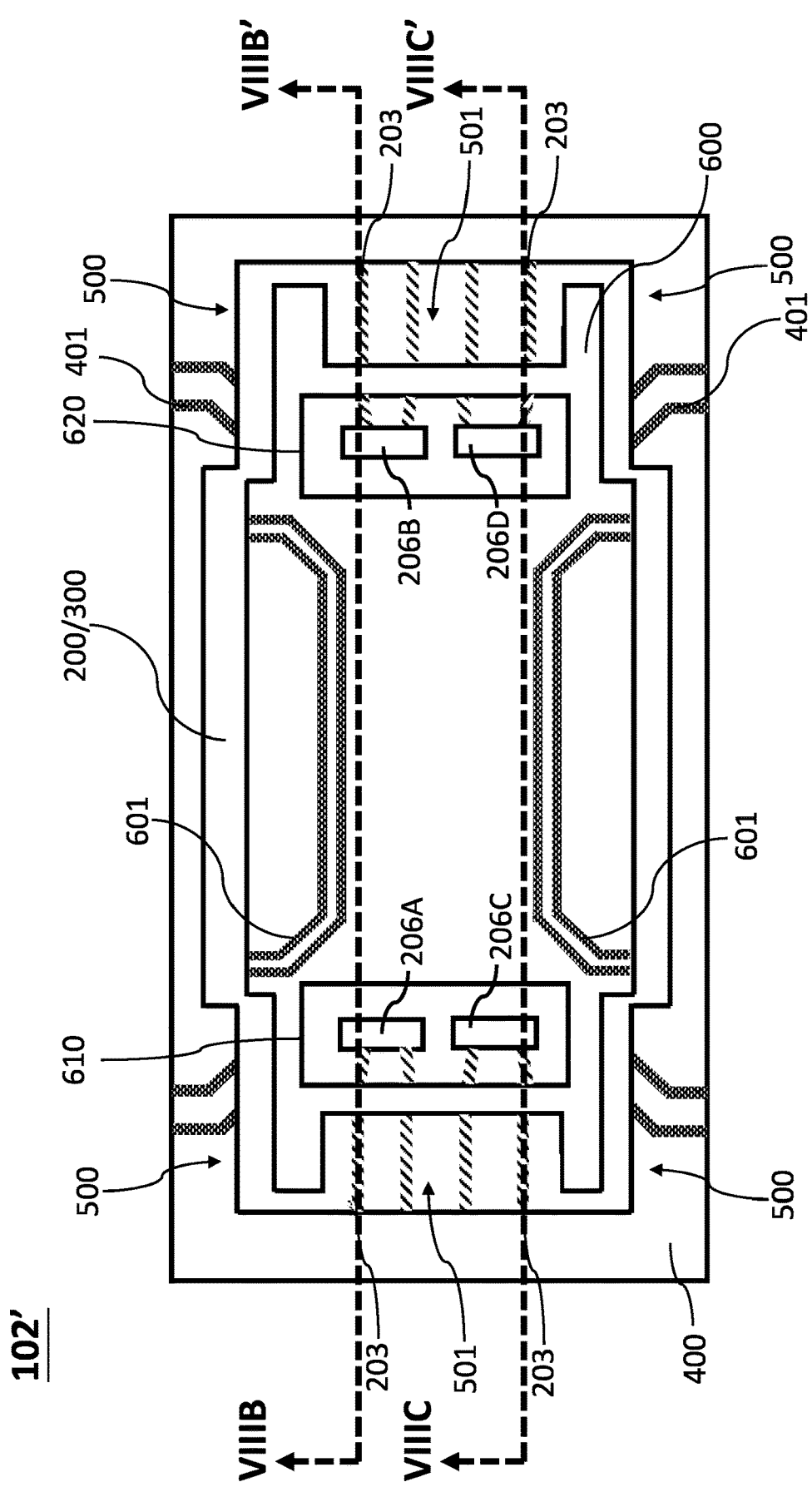
Figure 8B:
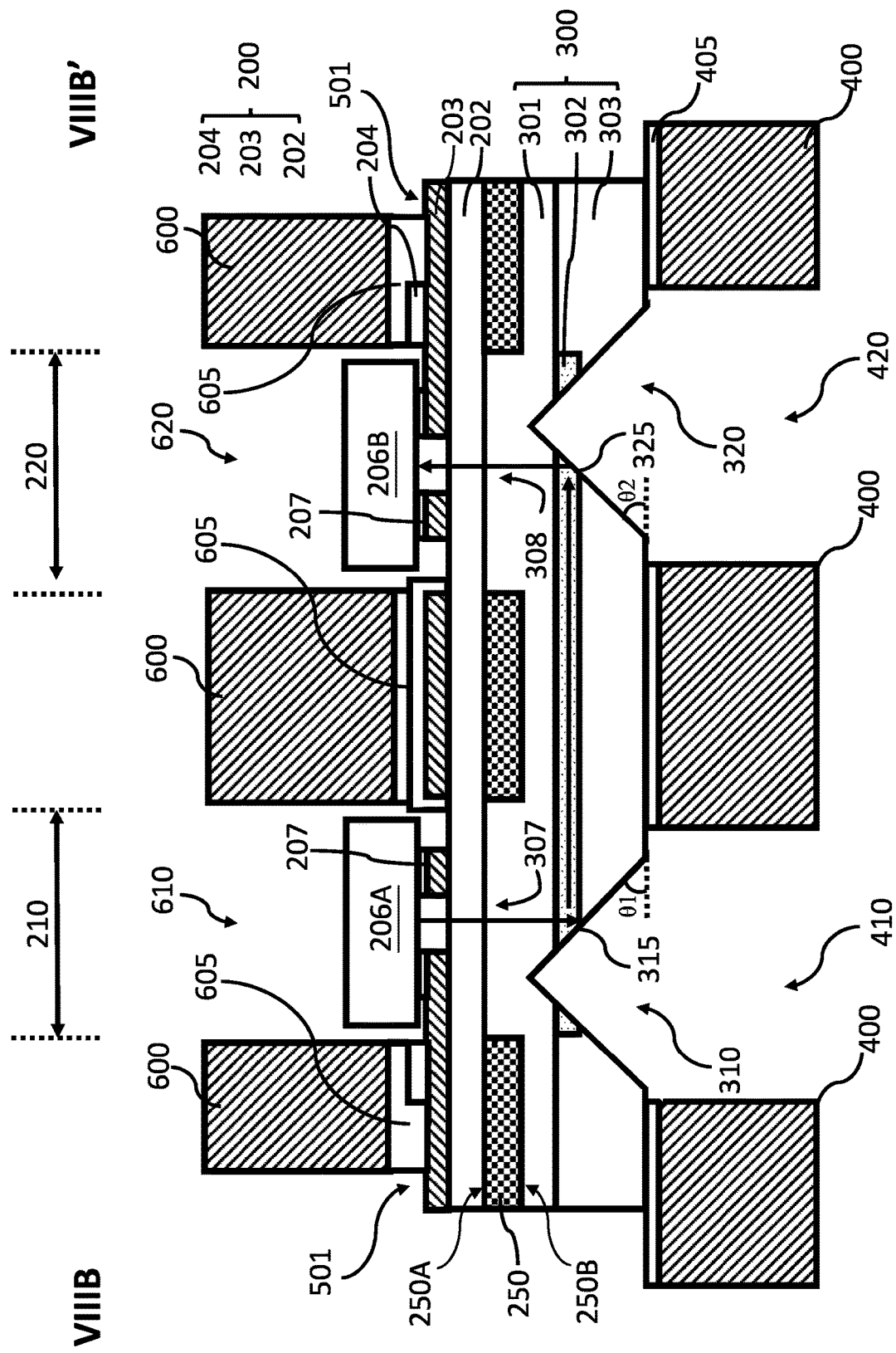
FIG. 8B is a schematic cross-sectional view of the hybrid multi-layered optical flexible printed circuit device 102 according to Embodiment 5 of this invention along with the cross-sectional line VIIIB-VIIIB' shown in FIG. 8A.
Figure 8B:
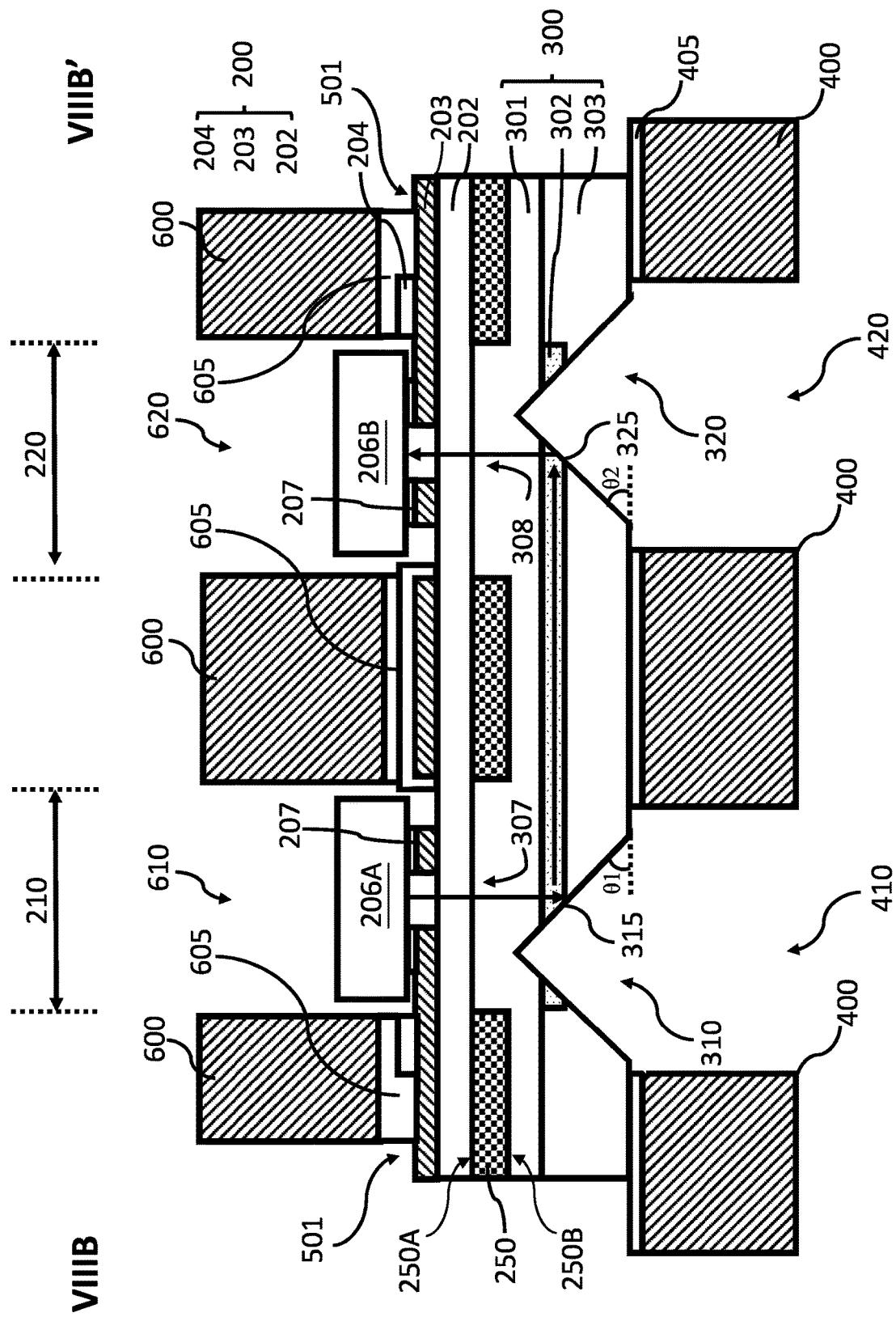

A hybrid multi-layered optical flexible printed circuit device 102 according to Embodiment 5 of this invention as shown in FIGS. 8A~8B is disclosed, which was manufactured by the steps illustrated in the flowcharts shown in FIG. 2.

Please refer to FIGS. 8A~8B and FIG. 2. FIG. 8A is a schematic top view of a hybrid multi-layered optical flexible printed circuit device 102 according to Embodiment 5 of this invention. FIG. 8B is a schematic cross-sectional view of the hybrid multi-layered optical flexible printed circuit device 102 according to Embodiment 5 of this invention along with the cross-sectional line VIIIB-VIIIB' shown in FIG. 8A. As shown in FIGS. 8A~8B, the structure of the hybrid multi-layered optical flexible printed circuit device 102 according to Embodiment 5 of this invention is similar to that of the hybrid multi-layered optical flexible printed circuit device 100 according to Embodiment 1 of this invention as shown in FIGS. 1A~1B except that an additional second flexible printed circuit board 600 including second metal traces 601, a third open region 610 aligned with the first open window 307 and a fourth open region 620 aligned with the second open window 308 was provided to form on the intrinsic film 200 in the steps 680~690 of the manufacturing method shown in FIG. 2. The second flexible printed circuit board 600 including second metal traces 601 provides a flexible layout platform configured for auxiliary connections for example but not limited to high-speed electrical signals (data signals), low-speed electrical signals (control signals) or power (DC/AC Volt).

Similarly, the first flexible printed circuit board 400 and the second flexible printed circuit board 600 shown in FIGS. 8A~8B can be a single-layered flexible printed circuit board, a double-layered flexible printed circuit board, or a multi-layered flexible printed circuit board.

As shown in FIGS. 8A~8B, the second flexible printed circuit board 600 was formed on the intrinsic film 200 via a second adhesive layer 605. According to other embodiments of this invention, the second flexible printed circuit board 600 can also alternatively be formed the intrinsic film 200 via a second anisotropic conductive film (not shown), and/or second solder balls (not shown), and/or second metal bumps (not shown), and even in combination with the second adhesive layer 605.

As shown in FIGS. 8A~8B, the hybrid multi-layered optical flexible printed circuit device 100 further comprises a first connection window 500 formed throughout the intrinsic film 200, the optical flexible substrate 250 and the optical waveguide film 300 to expose part of the first metal traces 401 of the first flexible printed circuit board 400 such that power, high-speed electrical signals and low-speed electrical signals can be coupled between the first flexible printed circuit board 400 and input/output ports respectively, and a second connection window 501 formed throughout the second flexible printed circuit board 600 to expose part of the patterned metal layer 203 of the intrinsic film 200, such that not only high-speed electrical signals can be linked between and the first optoelectronic device 206A, the second optoelectronic device 206B and outside devices (not shown), but also low-speed or power trail can be linked between each end-point of hybrid multi-layered optical flexible printed circuit device 102.

Similarly, as shown in FIGS. 8A~8B, the first optoelectronic device 206A is an optical signal emitting device used to convert electronic signals into optical intensity signals and emit into the waveguide film 300 thereafter, and the second optoelectronic device 206B is an optical signal receiving device used to convert optical intensity signals received from the waveguide film 300 into electrical signals. The first slant surface 315 of the first notch 310 is configured as an optical reflector, such that the optical intensity signals emitted by the first optoelectronic device 206A can be vertically inclined and coupled to the waveguide core layer 302, and the optical intensity signals from the waveguide core layer 302 can be further vertically inclined by the second notch 320 configured as another optical reflector to make the optical intensity signals received by the second optoelectronic device 206B.

Embodiment 6

A hybrid multi-layered optical flexible printed circuit device 102' according to Embodiment 6 of this invention as shown in FIGS. 8A'~8C' is disclosed, which was manufactured by the steps illustrated in the flowcharts shown in FIG. 2.

Figure 8C:
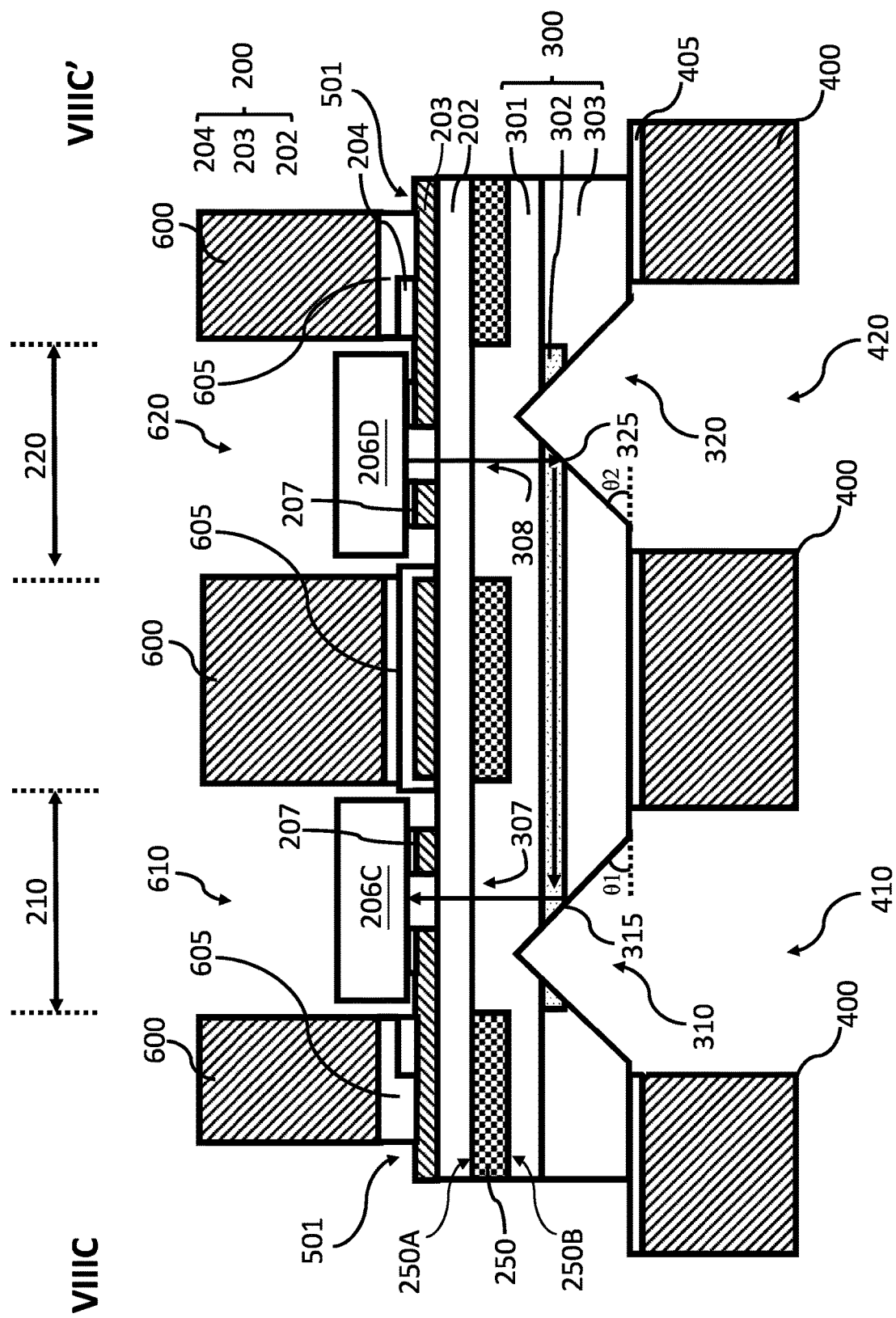
FIG. 8C' is a schematic cross-sectional view of the hybrid multi-layered optical flexible printed circuit device 102' according to Embodiment 6 of this invention along with the cross-sectional line VIIIC-VIIIC' shown in FIG. 8A'.

Please refer to FIGS. 8A'~8C' and FIG. 2. FIG. 8A' is a schematic top view of a hybrid multi-layered optical flexible printed circuit device 102' according to Embodiment 6 of this invention. FIG. 8B' is a schematic cross-sectional view of the hybrid multi-layered optical flexible printed circuit device 102' according to Embodiment 6 of this invention along with the cross-sectional line VIIIB-VIIIB' shown in FIG. 8A'. FIG. 8C' is a schematic cross-sectional view of the hybrid multi-layered optical flexible printed circuit device 102' according to Embodiment 6 of this invention along with the cross-sectional line VIIIC-VIIIC' shown in FIG. 8A'. As shown in FIGS. 8A'~8C', the structure of the hybrid multi-layered optical flexible printed circuit device 102' according to Embodiment 6 of this invention is similar to that of the hybrid multi-layered optical flexible printed circuit device 102 according to Embodiment 5 of this invention as shown in FIGS. 8A~8B except that the hybrid multi-layered optical flexible printed circuit device 102' further comprises a third optoelectronic device 206C and a fourth optoelectronic device 206D respectively mounted on the patterned metal layer 203 in the first bonding region 210 and the second bonding region 220, and the optical intensity signals emitted by the fourth optoelectronic device 206D is received by the third optoelectronic device 206C through the waveguide core layer 302 of the optical waveguide film 300.

As shown in FIGS. 8A'~8C', and FIG. 2, a first optoelectronic device 206A and a third optoelectronic device 206C were respectively mounted on the patterned metal layer 203 in the first bonding region 210, and a second optoelectronic device 206B and a fourth optoelectronic device 206D were respectively mounted on the patterned metal layer 203 in the second bonding region 220 in step 710 of the manufacturing method shown in FIG. 2. The fourth optoelectronic device 206D is an optical signal emitting device used to convert electronic signals into optical intensity signals and emit into the waveguide film 300 thereafter, and the third optoelectronic device 206C is an optical signal receiving device used to convert optical intensity signals received from the waveguide film 300 into electrical signals. The fourth optoelectronic device 206D can be for example but not limited to a VCSEL (Vertical-Cavity Surface-Emitting Laser) or a PD (Photo Diode), and the third optoelectronic device 206C can be for example but not limited to a VCSEL (Vertical-Cavity Surface-Emitting Laser) receiver or a PD (Photo Diode) receiver. The second slant surface 325 of the second notch 320 is also configured as an optical reflector, such that the optical intensity signals emitted by the fourth optoelectronic device 206D can be vertically inclined and coupled to the waveguide core layer 302, and the optical intensity signals from the waveguide core layer 302 can be further vertically inclined by the first notch 310 configured as another optical reflector to make the optical intensity signals received by the third optoelectronic device 206C.

As shown in FIGS. 8A'~8C', the hybrid multi-layered optical flexible printed circuit device 102' further comprises a first connection window 500 formed throughout the intrinsic film 200, the optical flexible substrate 250 and the optical waveguide film 300 to expose part of the first metal traces 401 of the first flexible printed circuit board 400 such that power, high-speed electrical signals and low-speed electrical signals can be coupled between the first flexible printed circuit board 400 and input/output ports respectively, and a second connection window 501 formed throughout the second flexible printed circuit board 600 to expose part of the patterned metal layer 203 of the intrinsic film 200, such that not only high-speed electrical signals can be linked between the first optoelectronic device 206A, the second optoelectronic device 206B, the third optoelectronic device 206C, the optoelectronic device 206D and outside devices (not shown), but also low-speed or power trail can be linked between each end-point of hybrid multi-layered optical flexible printed circuit device 102'.

Similarly, the third optoelectronic device 206C and the fourth optoelectronic device 206D maybe respectively flip-chip mounted on the patterned layer 203 in the first bonding region 210 and the second bonding region 220 through the bonding pads 207 thereof, and preferably mounted on the patterned layer 203 with a surface finishing layer (not shown) formed via electroplating or electroless plating thereon in the first bonding region 210 and the second bonding region 220 to enhance the bonding affinity between the third optoelectronic device 206C, the fourth optoelectronic device 206D and the patterned metal layer 203.

Similarly, the first flexible printed circuit board 400 and the second flexible printed circuit board 600 shown in FIGS. 8A'~8C' can be a single-layered flexible printed circuit board, a double-layered flexible printed circuit board, or a multi-layered flexible printed circuit board.

As mentioned above, high alignment accuracy between the intrinsic film 200 and the optical waveguide layer 300 can be achieved by photography or printing techniques. The first flexible printed circuit board 400 is formed on the optical waveguide layer 300 via an adhesive layer 405, and/or a first anisotropic conductive film (not shown), and/or solder balls (not shown), and/or metal bumps (not shown), and/or the second flexible printed circuit board 600 is formed on the intrinsic film 200 via an adhesive layer 605, and/or a first anisotropic conductive film (not shown), and/or solder balls (not shown), and/or metal bumps (not shown), therefore a highly accurate technique to align the first flexible printed circuit board 400 with the intrinsic film 200, and/or the second flexible printed circuit board 600 with the intrinsic film 200 is not required. Accordingly, above-mentioned hybrid multi-layered optical flexible printed circuit devices 100, 100,101, 101', 102 and 102' are suitable for applications supporting high-speed internet and high-definition video and 3D graphics and gaming access and a wide area of RF functions such as Wi-Fi, Bluetooth, WLAN, GPS, GSM and other mobile devices, for example but not limited to smartphones, laptops, or tablets.

Although particular embodiments have been shown and described, it should be understood that the above discussion is not intended to limit the present invention to these embodiments. Persons skilled in the art will understand that various changes and modifications may be made without departing from the scope of the present invention as literally and equivalently covered by the following claims.

What is claimed is:

1. A hybrid multi-layered optical flexible printed circuit device, comprising:
    an optical flexible substrate including a first open window and a second open window with a first surface and a second surface opposite to each other;
    an intrinsic film including a first bonding region aligned with the first open window and a second bonding region aligned with the second open window formed on the first surface of the optical flexible substrate;
    an optical waveguide film including a first notch with a first slant surface aligned with the first bonding region, and a second notch with a second slant surface aligned with the second bonding region formed on the second surface of the optical flexible substrate and encompassed the first open window and the second open window;
    a first flexible printed circuit board including first metal traces, a first open region aligned with the first open window and a second open region aligned with the second open window formed on the optical waveguide film, and/or a second flexible printed circuit board including second metal traces, a third open region aligned with the first open window and a fourth open region aligned with the second open window formed on the intrinsic film; and
    a first optoelectronic device and a second optoelectronic device respectively mounted in the first bonding region and the second bonding region of the intrinsic film;
    wherein, the first optoelectronic device is used to convert electrical signals into optical intensity signals and emit into the waveguide film thereafter, and the second optoelectronic device is used to convert optical intensity signals received from the waveguide film into electrical signals.

2. The hybrid multi-layered optical flexible printed circuit device as claimed in claim 1, wherein the intrinsic film comprises an insulative layer, a patterned metal layer formed on the insulative layer and a cover layer formed on the patterned metal layer to cover part of the patterned metal layer, wherein the intrinsic film is formed on the first surface of the optical flexible substrate via the insulative layer, and the patterned metal layer in the first bonding region and the patterned metal layer in the second bonding region are exposed.

3. The hybrid multi-layered optical flexible printed circuit device as claimed in claim 2, further comprising a first connection window formed throughout the intrinsic film, the optical flexible substrate and the optical waveguide film to expose part of the first metal traces of the first flexible printed circuit board, and/or a second connection window formed throughout the second flexible printed circuit board to expose part of the patterned metal layer of the intrinsic film.

4. The hybrid multi-layered optical flexible printed circuit device as claimed in claim 1, wherein the optical waveguide film comprises an upper cladding layer, a lower cladding layer and a waveguide core layer sandwiched therebetween, and the first notch and the second notch are throughout the lower cladding layer, the waveguide core layer and part of the upper cladding layer, and the optical waveguide film is formed on the second surface of the optical flexible substrate and encompassed the first open window and the second open window via the upper cladding layer.

5. The hybrid multi-layered optical flexible printed circuit device as claimed in claim 1, wherein the optical flexible substrate is formed by a material selected from one of a group consisting of a polyimide, a metal and a liquid crystal polymer (LOP).

6. The hybrid multi-layered optical flexible printed circuit device as claimed in claim 1, further comprising a third optoelectronic device and a fourth optoelectronic device respectively mounted in the first bonding region and the second bonding region, and the fourth optoelectronic device is used to convert electrical signals into optical intensity signals and emit into the waveguide film thereafter, and the third optoelectronic device is used to convert optical intensity signals received from the waveguide film into electrical signals.

7. The hybrid multi-layered optical flexible printed circuit device as claimed in claim 6, wherein the first optoelectronic device and the fourth optoelectronic device are individual optical signal emitting devices, and the second optoelectronic device and the third optoelectronic device are individual optical signal receiving devices.

8. The hybrid multi-layered optical flexible printed circuit device as claimed in claim 1, wherein the first flexible printed circuit board is a single-layered flexible printed circuit board, a double-layered flexible printed circuit board or a multi-layered flexible printed circuit board, and/or the second flexible printed circuit board is a single-layered flexible printed circuit board, a double-layered flexible printed circuit board or a multi-layered flexible printed circuit board.

9. The hybrid multi-layered optical flexible printed circuit device as claimed in claim 1, wherein the first slant surface of the first notch having an included angle θ1 ranging between 25 degree and 75 degree, and the second slant surface of the second notch having an included angle θ2 ranging between 25 degree and 75 degree.

10. The hybrid multi-layered optical flexible printed circuit device as claimed in claim 1, the first flexible printed circuit board is formed on the optical waveguide film via a first adhesive layer and/or a first anisotropic conductive film and/or first solder balls and/or first metal bumps, and/or the second flexible printed circuit board is formed on the intrinsic film via a second adhesive layer and/or a second anisotropic conductive film and/or second solder balls and/or second metal bumps.

11. A method for manufacturing a hybrid multi-layered optical flexible printed circuit device, comprising the steps of:
providing an optical flexible substrate with a first surface and a second surface opposite to each other;
forming an intrinsic film including a first bonding region and a second bonding region on the first surface of the optical flexible substrate;
forming a first open window aligned with the first bonding region and a second open window aligned with the second bonding region on the optical flexible substrate;
forming an optical waveguide film on the second surface of the optical flexible substrate and encompassed the first open window and the second open window;
forming a first flexible printed circuit board including first metal traces, a first open region aligned with the first open window and a second open region aligned with the second open window on the optical waveguide film, and/or forming a second flexible printed circuit board including second metal traces, a third open region aligned with the first open window and a fourth open region aligned with the second open window on the intrinsic film;
forming a first notch with a first slant surface aligned with the first bonding region on the optical waveguide film, and a second notch with a second slant surface aligned with the second bonding region on the optical waveguide film; and
mounting a first optoelectronic device and a second optoelectronic device respectively in the first bonding region and the second bonding region;
wherein, the first optoelectronic device is used to convert electrical signals into optical intensity signals and emit into the waveguide film thereafter, and the second optoelectronic device is used to convert optical intensity signals received from the waveguide film into electrical signals.

12. The method for manufacturing a hybrid multi-layered optical flexible printed circuit device as claimed in claim 11, wherein the intrinsic film comprises an insulative layer, a patterned metal layer formed on the insulative layer and a cover layer formed on the patterned metal layer to cover part of the patterned metal layer, wherein the intrinsic film is formed on the first surface of the optical flexible substrate via the insulative layer, and the patterned metal layer in the first bonding region and the patterned metal layer in the second bonding region are exposed.

13. The method for manufacturing a hybrid multi-layered optical flexible printed circuit devices as claimed in claim 12, further comprising a first connection window formed throughout the intrinsic film, the optical flexible substrate and the optical waveguide film to expose part of the first metal traces of the first flexible printed circuit board, and/or a second connection window formed throughout the second flexible printed circuit board to expose part of the patterned metal layer of the intrinsic film.

14. The method for manufacturing a hybrid multi-layered optical flexible printed circuit device as claimed in claim 11, wherein the optical waveguide film comprises an upper cladding layer, a lower cladding layer and a waveguide core layer sandwiched therebetween, and the first notch and the second notch are throughout the lower cladding layer, the waveguide core layer and part of the upper cladding layer, and the optical waveguide film is formed on the second surface of the optical flexible substrate and encompassed the first open window and the second open window via the upper cladding layer.

15. The method for manufacturing a hybrid multi-layered optical flexible printed circuit device as claimed in claim 11, wherein the optical flexible substrate is formed by a material selected from one of a group consisting of a polyimide, a metal and a liquid crystal polymer (LCP).

16. The method for manufacturing a hybrid multi-layered optical flexible printed circuit device as claimed in claim 11, further comprising a step of mounting a third optoelectronic device and a fourth optoelectronic device respectively in the first bonding region and the second bonding region, and the fourth optoelectronic device is used to convert electrical signals into optical intensity signals and emit into the waveguide film thereafter, and the third optoelectronic device is used to convert optical intensity signals received from the waveguide film into electrical signals.

17. The method for manufacturing a hybrid multi-layered optical flexible printed circuit device as claimed in claim 11, wherein the first flexible printed circuit board is a single-layered flexible printed circuit board, a double-layered flexible printed circuit board or a multi-layered flexible printed circuit board, and/or the second flexible printed circuit board is a single-layered flexible printed circuit board, a double-layered flexible printed circuit board or a multi-layered flexible printed circuit board.

18. The method for manufacturing a hybrid multi-layered optical flexible printed circuit device as claimed in claim 11, wherein the first notch and the second notch are respectively formed by laser cutting or mechanical cutting through the first open region and the second open region.

19. The method for manufacturing a hybrid multi-layered optical flexible printed circuit device as claimed in claim 11, wherein the first slant surface of the first notch having an included angle $\theta 1$ ranging between 25 degree and 75 degree, and the second slant surface of the second notch having an included angle $\theta 2$ ranging between 25 degree and 75 degree.

20. The method for manufacturing a hybrid multi-layered optical flexible printed circuit device as claimed in claim 11, wherein the first flexible printed circuit board is formed on the optical waveguide film via a first adhesive layer and/or a first anisotropic conductive film and/or first solder balls and/or first metal bumps, and/or the second flexible printed circuit board is formed on the intrinsic film via a second adhesive layer and/or a second anisotropic conductive film and/or second solder balls and/or second metal bumps.

* * * * *